United States Patent
Hirose et al.

(10) Patent No.: US 8,106,346 B2
(45) Date of Patent: Jan. 31, 2012

(54) PHOTODETECTOR

(75) Inventors: Atsushi Hirose, Kanagawa (JP); Jun Koyama, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 332 days.

(21) Appl. No.: 12/550,471

(22) Filed: Aug. 31, 2009

(65) Prior Publication Data

US 2010/0051787 A1 Mar. 4, 2010

(30) Foreign Application Priority Data

Sep. 4, 2008 (JP) ................................ 2008-226774

(51) Int. Cl.
*H01J 40/14* (2006.01)

(52) U.S. Cl. ......... 250/214 DC; 250/214 C; 250/214 A; 250/214 L; 250/208.1; 341/119

(58) Field of Classification Search ............... 250/208.1, 250/214 R, 214 DC, 214 C, 214 A, 214 L; 341/119, 138, 155; 327/350, 362
See application file for complete search history.

(56) References Cited

U.S. PATENT DOCUMENTS

| | | | |
|---|---|---|---|
| 5,850,195 A * | 12/1998 | Berlien et al. | ............... 341/137 |
| 6,504,168 B2 | 1/2003 | Yasuda | |
| 6,556,155 B1 | 4/2003 | Wiles, Jr. | |
| 7,969,223 B1 * | 6/2011 | Gilbert | ........................ 327/350 |
| 2003/0020969 A1 | 1/2003 | Kimura | |
| 2006/0273830 A1 | 12/2006 | Suzuki et al. | |

FOREIGN PATENT DOCUMENTS

| | | |
|---|---|---|
| EP | 1 619 509 A1 | 1/2006 |
| JP | 06-313840 | 11/1994 |
| JP | 2002-131854 | 5/2002 |

* cited by examiner

*Primary Examiner* — Kevin Pyo
(74) *Attorney, Agent, or Firm* — Nixon Peabody LLP; Jeffrey L. Costellia

(57) ABSTRACT

A photodetector includes a photoelectric conversion circuit that generates a first voltage by converting a first current generated in accordance with the illuminance of incident light into log-compressed voltage; a temperature compensation circuit that generates a second voltage by performing temperature compensation for the first voltage and generate a second current by converting the second voltage into current; and a digital signal generation circuit that generates a clock signal having an oscillation frequency depending on the second current, counts pulses of the clock signal for a certain period, and generates a digital signal using the count value for the certain period as data.

14 Claims, 22 Drawing Sheets

PHOTODETECTOR

BACKGROUND OF THE INVENTION

1. Field of the Invention

The present invention relates to a photodetector.

2. Description of the Related Art

A number of photodetectors used for detecting an electromagnetic wave are known, and for example photodetectors having sensitivity to light from the ultraviolet range to the infrared range are collectively referred to as optical sensors. Among them, an optical sensor having sensitivity in the visible light range with a wavelength of 400 nm to 700 nm is particularly referred to as a visible light sensor, and a large number of visible light sensors are used for devices which need illuminance adjustment, control of an on state and an off state, or the like depending on human living environment.

For example, in a display device, ambient brightness can be detected by an optical sensor to adjust the display luminance. By detecting the ambient brightness and obtaining appropriate display luminance, the visibility can be improved and unnecessary electric power of the display device can be reduced. Examples of display devices including an optical sensor for adjusting display luminance are mobile phones and computers with a display portion. Further, in a display device, the luminance of a backlight can be detected by an optical sensor to adjust the luminance of a display screen. An example of a display device including a backlight is a liquid crystal display device.

In a device including the optical sensor, a photoelectric conversion element such as a photodiode is used in a portion for detecting light (also referred to as a sensor portion), and the intensity of light can be detected based on the amount of current that flows into the photoelectric conversion element when light enters the photoelectric conversion element. Patent Document 1 discloses an electric charge accumulation optical sensor having the following structure. As an analog signal, a comparator detects a voltage that is changed by discharging electric charge accumulated in a capacitor with a current which flows from a photodiode depending on the amount of incident light, by a constant current circuit (also referred to as a constant current source); and a counter circuit and a latch circuit generate a digital signal by using the time it takes for change of the voltage detected by the comparator.

REFERENCE

Patent Document 1: Japanese Published Patent Application No. H6-313840

SUMMARY OF THE INVENTION

A conventional photodetector has a problem of a narrow dynamic range with respect to illuminance. This is because a generated photocurrent is linearly increased as the illuminance is higher, and further, a value of an output voltage is linearly increased as a value of the photocurrent is increased. When the illuminance dynamic range is narrow and light whose illuminance exceeds a certain range enters a photoelectric conversion element, the display luminance cannot be adjusted.

For example, since a digital signal needs a larger number of bits than an analog signal, the problem of a narrow dynamic range becomes more noticeable when a digital signal is generated.

In view of the foregoing problem, an object of the present invention is to increase the dynamic range with respect to the illuminance of incident light.

One embodiment of the present invention is a photodetector including a photoelectric conversion circuit configured to generate a first voltage by converting a first current generated depending on the illuminance of light entering the photoelectric conversion, into log-compressed voltage; a temperature compensation circuit configured to generate a second voltage by performing temperature compensation for the first voltage and generate a second current by converting the second voltage into current; and a digital signal generation circuit configured to generate a clock signal oscillating at a frequency depending on the second current, count the number of pulses of the clock signal for a certain period, and generate a digital signal using a count value for the certain period as data.

One embodiment of the present invention is a photodetector including a photoelectric conversion circuit which includes a photoelectric conversion element and a first diode and is configured to generate a first voltage by converting a first current generated depending on the illuminance of light entering the photoelectric conversion element, into log-compressed voltage by the first diode; a temperature compensation circuit configured to perform temperature compensation for the first voltage; and a digital signal generation circuit. The temperature compensation circuit includes a reference voltage generation circuit which includes a resistor and a second diode and is configured to generate a reference voltage by converting a current flowing through the resistor into log-compressed voltage by the second diode; an arithmetic circuit configured to generate a second voltage depending on a difference between the first voltage and the reference voltage; and an output circuit configured to generate a second current by converting the second voltage into current. The digital signal generation circuit includes a first clock signal generation circuit configured to generate a first clock signal oscillating at a frequency depending on the second current; a second clock signal generation circuit configured to generate a second clock signal oscillating at a predetermined frequency; a first counter circuit configured to count the number of pulses of the first clock signal; a second counter circuit configured to set a period for counting the first clock signal by counting the number of pulses of the second clock signal up to a given value; and a latch circuit configured to hold a count value of the first clock signal as digital signal data.

In the photodetector which is one embodiment of the present invention, the first clock signal generation circuit can include a ramp wave signal generation circuit configured to generate a ramp wave signal depending on the second current; a waveform shaping circuit configured to generate a square wave signal by shaping the ramp wave signal; and a buffer circuit configured to generate the first clock signal from the square wave signal.

In the photodetector which is one embodiment of the present invention, the second clock signal generation circuit can include a constant current circuit including a current source for generating a constant current; a ramp wave signal generation circuit configured to generate a ramp wave signal depending on the constant current; a waveform shaping circuit configured to generate a square wave signal by shaping the ramp wave signal; and a buffer circuit configured to generate the second clock signal from the square wave signal.

Note that in the document (the specification and the scope of claims) of the present application, a transistor has at least three terminals of a gate, a source, and a drain. For example, in a field-effect transistor, a gate refers to a gate electrode portion (including a region serving as the gate, a conductive layer, a wiring, or the like) or part of a portion electrically connected to the gate electrode. Moreover, a source refers to a source electrode portion (including a region serving as the source, a conductive layer, a wiring, or the like) or part of a portion electrically connected to the source electrode. Further, a drain refers to a drain electrode portion (including a region serving as the drain, a conductive layer, a wiring, or the like) or part of a portion electrically connected to the drain electrode.

In the document (the specification and the scope of claims) of the present application, the source and the drain of the transistor change depending on the structure, the operating conditions, or the like of the transistor; therefore, it is difficult to determine which is the source and which is the drain. Accordingly, one terminal which is freely selected from the source and the drain is referred to as one of the source and the drain, whereas the other terminal is referred to as the other of the source and the drain.

Note that in the document (the specification and the scope of claims) of the present application, a diode (including a photodiode) has two electrodes of an anode and a cathode. Accordingly, a terminal including the anode is referred to as a first terminal of the diode, and a terminal including the cathode is referred to as a second terminal of the diode.

Note that in general, a voltage refers to the difference between potentials of two points (also referred to as the potential difference), and a potential refers to electrostatic energy (electric potential energy) that a unit charge in an electrostatic field at one point has. However, in an electric circuit, the potential difference between a potential at one point and a potential serving as a reference (also referred to as a reference potential) is sometimes used as a value, for example. Moreover, both the value of a voltage and the value of a potential are represented by volts (V); therefore, in the document (the specification and the scope of claims) of the present application, a voltage at one point is sometimes used as a value unless otherwise specified.

According to one embodiment of the present invention, a log-compressed voltage is generated from a current which is generated by a photoelectric conversion circuit in accordance with the illuminance of incident light; the voltage is converted into a current by a temperature compensation circuit; and a digital signal depending on the log-compressed voltage is generated from the current obtained by the conversion, whereby the dynamic range with respect to the illuminance of incident light can be increased.

DETAILED DESCRIPTION OF THE INVENTION

Embodiments of the present invention will be described with reference to the accompanying drawings. Note that the present invention is not limited to the following description, and it is easily understood by those skilled in the art that modes and details of the present invention can be variously changed without departing from the spirit and the scope of the present invention. Therefore, the present invention is not construed as being limited to the description of the following embodiments.

Embodiment 1

In this embodiment, a photodetector which is one embodiment of the present invention will be described.

Figure 1:
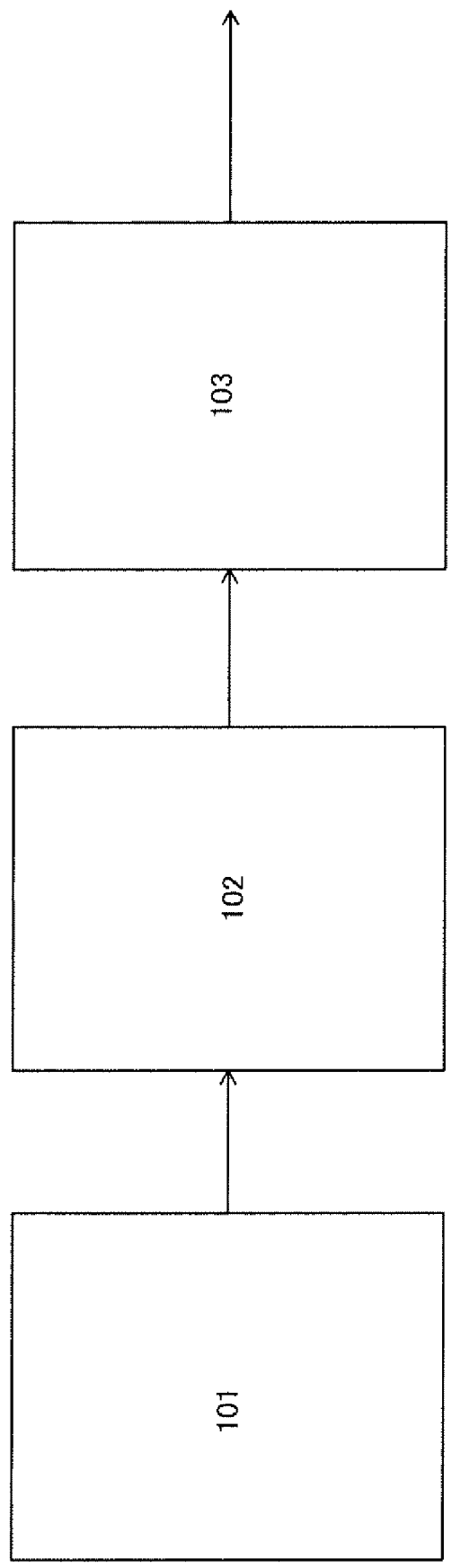
FIG. 1 is a block diagram illustrating an example of a structure of a photodetector in Embodiment 1.

First, a structure of a photodetector in this embodiment will be described with reference to FIG. 1. FIG. 1 is a block diagram illustrating a structure of a photodetector in this embodiment.

The photodetector illustrated in FIG. 1 includes a photoelectric conversion circuit 101, a temperature compensation circuit 102, and a digital signal generation circuit 103.

The photoelectric conversion circuit 101 has functions of generating a first current $I_{101}$ in accordance with the illuminance of light entering from the outside and generating a first voltage $V_{101}$ by converting the generated first current $I_{101}$ into log-compressed voltage.

The temperature compensation circuit 102 has functions of performing temperature compensation for the first voltage $V_{101}$ and generating a second current $I_{102}$ by converting the voltage generated by the temperature compensation into current.

The digital signal generation circuit 103 has functions of generating a clock signal that oscillates at a frequency depending on the second current $I_{102}$, counting pulses of the clock signal for a certain period, and generating a digital signal using the count value as data.

Next, an example of a specific structure of each circuit will be described.

Figure 2:
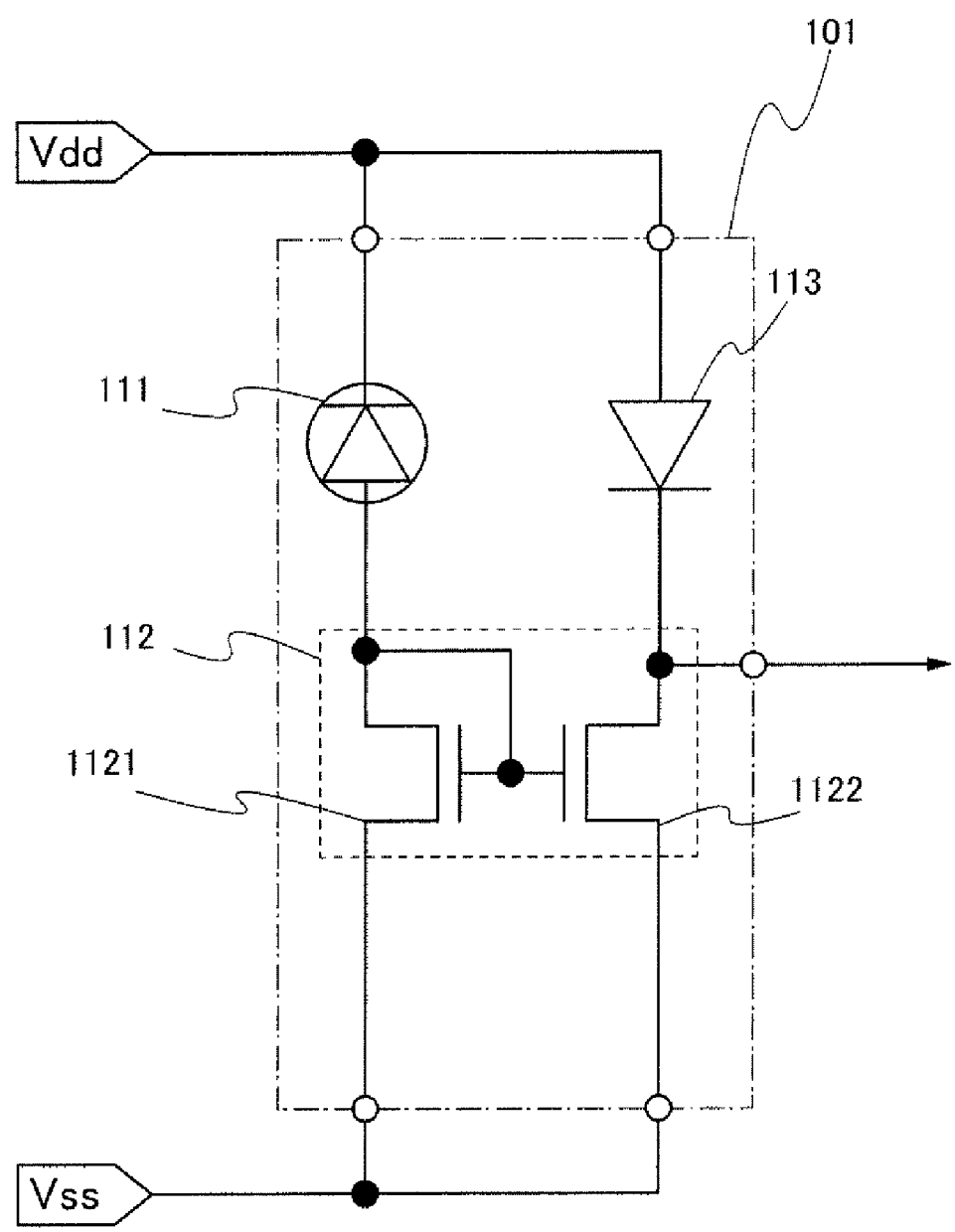
FIG. 2 is a circuit diagram illustrating an example of a structure of a photoelectric conversion circuit illustrated in FIG. 1.

An example of a structure of the photoelectric conversion circuit 101 is illustrated in FIG. 2. FIG. 2 is a circuit diagram illustrating an example of a structure of the photoelectric conversion circuit illustrated in FIG. 1.

The photoelectric conversion circuit 101 illustrated in FIG. 2 includes a photoelectric conversion element 111, a current mirror circuit 112, and a diode 113.

The photoelectric conversion element 111 has a function that allows a photocurrent $I_L$ to flow therethrough when light enters the photoelectric conversion element 111. The amount of photocurrent $I_L$ is proportional to the illuminance of incident light.

As the photoelectric conversion element 111, a PIN photodiode, a PN photodiode, or a phototransistor can be used, for example. In this embodiment, the case where a PIN photodiode is used as the photoelectric conversion element 111 is described as an example. By using the PIN photodiode as the photoelectric conversion element 111, response characteristics of a depletion layer to light irradiation can be improved. The specific structure will be described below.

A first terminal, which is on the anode side, of the photoelectric conversion element 111 is electrically connected to the current mirror circuit 112. Moreover, a high power supply voltage (also referred to as Vdd) is supplied to a second terminal, which is on the cathode side, of the photoelectric conversion element 111.

The current mirror circuit 112 has a function of generating a current flowing in the same direction as the photocurrent $I_L$, based on the photocurrent $I_L$. An example of the specific structure will be described below.

The current mirror circuit 112 illustrated in FIG. 2 includes a transistor 1121 and a transistor 1122.

A gate of the transistor 1121 is electrically connected to one of a source and a drain of the transistor 1121 and the first terminal of the photoelectric conversion element 111. Moreover, a low power supply voltage (also referred to as Vss) is supplied to the other of the source and the drain of the transistor 1121.

A gate of the transistor 1122 is electrically connected to the gate of the transistor 1121. One of a source and a drain of the transistor 1122 is electrically connected to the diode 113. The low power supply voltage is applied to the other of the source and the drain of the transistor 1122.

Next, the operation of the current mirror circuit 112 will be described.

First, a current flows between the drain and the source of the transistor 1121 in accordance with the photocurrent $I_L$. Further, since a voltage of the gate of the transistor 1121 and a voltage of the gate of the transistor 1122 become equal to each other a current also flows between the drain and the source of the transistor 1122.

Note that the current mirror circuit 112 can amplify or attenuate a current to be generated or can increase the number of currents to be generated by changing the size of the transistor 1121 or the transistor 1122 or changing the number of the transistors 1121 or the transistors 1122. For example, when a plurality of transistors 1122 are provided in such a manner that sources of the transistor 1122 are electrically connected to each other and drains thereof are electrically connected to each other so that the plurality of transistors 1122 are electrically connected in parallel with each other, a current larger than the photocurrent $I_L$ can be generated.

Alternatively, the photoelectric conversion circuit 101 illustrated in FIG. 1 can have a structure where a plurality of current mirror circuits 112 having different amplification factors or different attenuation factors from each other are provided. With this structure, any of current mirror circuits can be selected depending on the illuminance of light entering the photoelectric conversion element 111 in the following manner, for example. When the illuminance is lower than a given value, a current mirror circuit whose amplification factor or attenuation factor is set such that a current to be generated is larger than the photocurrent $I_L$, and when the illuminance is higher than a given value, a current mirror circuit whose amplification factor or attenuation factor is set such that a current to be generated is approximately the same as or smaller than the photocurrent $I_L$. Accordingly, high resolution can be obtained even when the illuminance of light entering the photoelectric conversion element 111 is higher or lower than a given value.

Note that although the current mirror circuit 112 is not necessarily provided, by the provision of the current mirror circuit 112, a current large enough to perform photoelectric conversion can be generated even when the illuminance of incident light is so low that photoelectric conversion cannot be performed.

In addition, in the photoelectric conversion circuit 101 in this embodiment, a current flowing between the drain and the source of the transistor 1122 is the first current $I_{101}$ in the case of providing the current mirror circuit 112, whereas a current generated by the photoelectric conversion element 111 is the first current $I_{101}$ in the case of not providing the current mirror circuit 112.

As the diode 113, a PN diode or a PIN diode can be used, for example. Alternatively, a diode-connected transistor or the like can be used. For the photoelectric conversion circuit 101 illustrated in FIG. 2, the case where a PIN diode is used as the diode 113 is described as an example.

The high power supply voltage is applied to a first terminal, which is on the anode side, of the diode 113. Moreover, a second terminal, which is on the cathode side, of the diode 13 is electrically connected to one of the source and the drain of the transistor 1122 in the current mirror circuit 112. By the provision of the diode 113, the first current $I_{101}$, is converted into a log-compressed voltage. The voltage converted at this time is the first voltage $V_{101}$.

Note that in the case where the current mirror circuit 112 is not provided, a photoelectric conversion circuit with a structure where the second terminal of the diode 113 is electrically connected to the first terminal of the photoelectric conversion element 111 can function as the photoelectric conversion circuit 101 in this embodiment, like the photoelectric conversion circuit 101 illustrated in FIG. 2.

Figure 3:
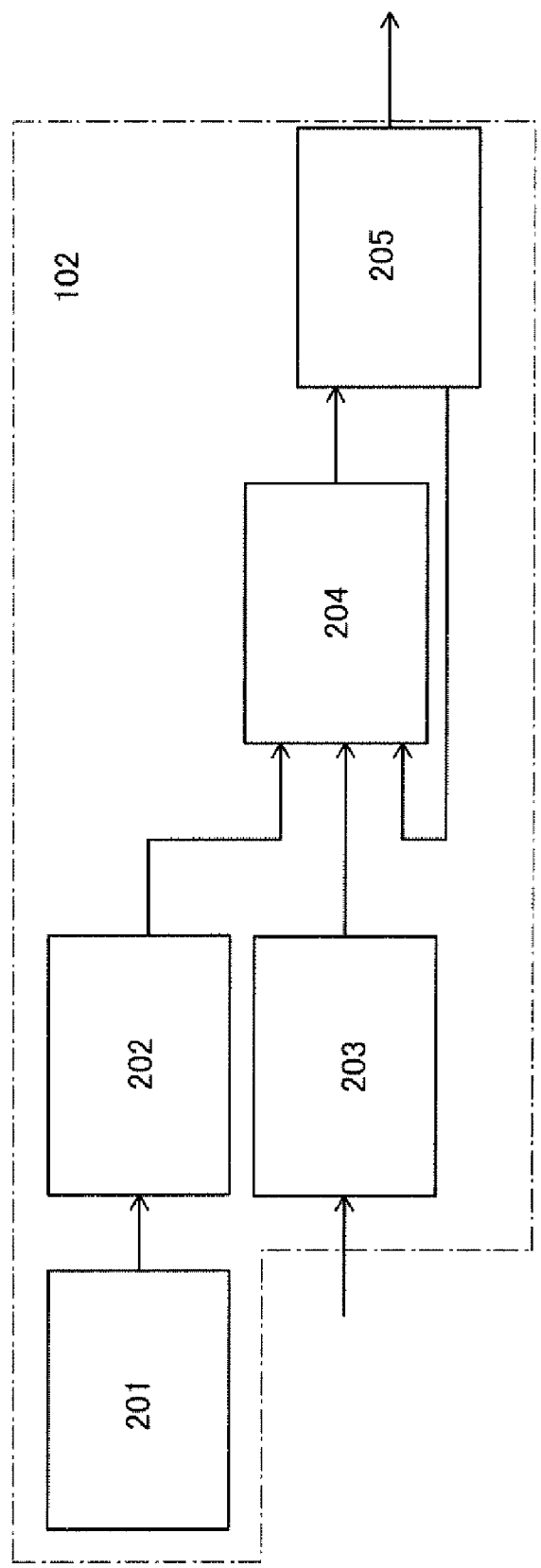
FIG. 3 is a block diagram illustrating an example of a structure of a temperature compensation circuit illustrated in FIG. 1.

Next, an example of a structure of the temperature compensation circuit 102 illustrated in FIG. 1 will be described with reference to FIG. 3. FIG. 3 is a block diagram illustrating an example of a structure of the temperature compensation circuit illustrated in FIG. 1.

The temperature compensation circuit 102 illustrated in FIG. 3 includes a reference voltage generation circuit 201, an amplifier circuit 202, an amplifier circuit 203, an arithmetic circuit 204, and an output circuit 205.

The reference voltage generation circuit 201 has a function of generating a reference voltage $Vref_{201}$ which is a constant voltage.

The amplifier circuit 202 has a function of amplifying the reference voltage $Vref_{201}$.

The amplifier circuit 203 has a function of amplifying the first voltage $V_{101}$.

The arithmetic circuit 204 has a function of generating a second voltage $V_{102}$ depending on the difference between the first voltage $V_{101}$ and the reference voltage $Vref_{201}$.

The output circuit 205 has a function of generating the second current $I_{102}$ by converting the second voltage $V_{102}$ into current.

Next, an example of a specific structure of each circuit will be described.

Figure 4:
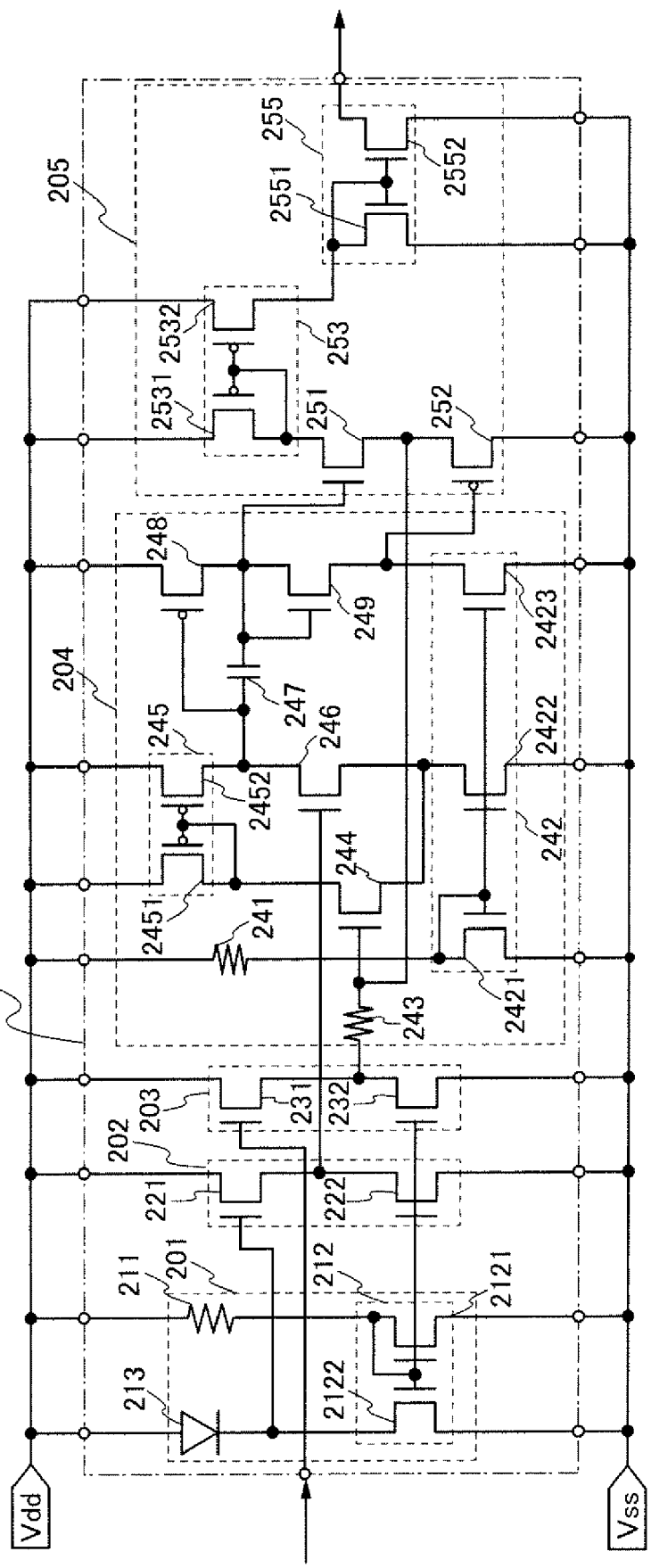
FIG. 4 is a circuit diagram illustrating an example of a structure of a temperature compensation circuit illustrated in FIG. 3.

An example of specific structures of the reference voltage generation circuit 201, the amplifier circuit 202, the amplifier circuit 203, the arithmetic circuit 204, and the output circuit 205 is illustrated in FIG. 4. FIG. 4 is a circuit diagram illustrating an example of a structure of the temperature compensation circuit illustrated in FIG. 3.

The reference voltage generation circuit 201 illustrated in FIG. 4 includes a resistor 211, a current mirror circuit 212, and a diode 213.

The high power supply voltage is applied to a first terminal of the resistor 211. A current depending on a resistance value of the resistor 211 flows between the terminals of the resistor 211. Note that the current flowing at this time is preferably a constant current.

The current mirror circuit 212 has a function of generating a current that flows in the same direction as the current flowing through the resistor 211, based on the current flowing through the resistor 211.

For the structure of the current mirror circuit 212, any of structures that can be applied to the current mirror circuit 112 in the photoelectric conversion circuit 101 in FIG. 2 can be employed, for example. Further, although the current mirror circuit 212 is not necessarily provided, by the provision of the current mirror circuit 212, a plurality of currents which are the same as the original current (e.g., the current flowing through the resistor 211) or which are obtained by amplifying or attenuating the original current can be generated. A specific structure of the current mirror circuit 212 illustrated in FIG. 4 will be described below.

The current mirror circuit 212 illustrated in FIG. 4 includes a transistor 2121 and a transistor 2122.

A gate of the transistor 2121 is electrically connected to one of a source and a drain of the transistor 2121 and a second terminal of the resistor 211. Moreover, the low power supply voltage is applied to the other of the source and the drain of the transistor 2121.

A gate of the transistor 2122 is electrically connected to the gate of the transistor 2121. One of a source and a drain of the transistor 2122 is electrically connected to the diode 213. Moreover, the low power supply voltage is applied to the other of the source and the drain of the transistor 2122.

Next, the operation of the current mirror circuit 212 will be described.

First, a current flows between the drain and the source of the transistor 2121 depending on the current flowing through the resistor 211. Further, since a voltage of the gate of the transistor 2121 and a voltage of the gate of the transistor 2122 become equal to each other, a current also flows between the drain and the source of the transistor 2122.

As the diode 213, any element that can be applied to the diode 113 in the photoelectric conversion circuit 101 in FIG. 2 can be used, for example, and it is preferable to use the same kind of element as that applied to the diode 113. An element that is the same kind as the diode 113 is used for the diode 213, whereby the difference of characteristics between the diode 213 and the diode 113 can be reduced, and more effective temperature compensation can be performed. In this embodiment, the case where a PIN diode is used as the diode 213 is described as an example.

The high power supply voltage is applied to a first terminal of the diode 213. Moreover, a second terminal of the diode 213 is electrically connected to one of the source and the drain of the transistor 2122 in the current mirror circuit 212.

In the reference voltage generation circuit 201 illustrated in FIG. 4, the reference voltage $Vref_{201}$ is generated by converting a current flowing between the drain and the source of the transistor 2122 into log-compressed voltage by the diode 213. Further, in the case where the current mirror circuit 212 is not provided, the reference voltage $Vref_{201}$ is generated by converting the current flowing through the resistor 211 into log-compressed voltage by the diode 213.

The amplifier circuit 202 illustrated in FIG. 4 includes a transistor 221 and a transistor 222.

A gate of the transistor 221 is electrically connected to the second terminal of the diode 213 in the reference voltage generation circuit 201. Moreover, the high power supply voltage is applied to one of a source and a drain of the transistor 221.

A gate of the transistor 222 is electrically connected to the gate of the transistor 2121 in the current mirror circuit 212 of the reference voltage generation circuit 201. One of a source and a drain of the transistor 222 is electrically connected to the other of the source and the drain of the transistor 221. Moreover the low power supply voltage is applied to the other of the source and the drain of the transistor 222.

The amplifier circuit 203 illustrated in FIG. 4 includes a transistor 231 and a transistor 232.

A gate of the transistor 231 is electrically connected to one of the source and the drain of the transistor 1122 in the current mirror circuit 112 of the photoelectric conversion circuit 101. Moreover, the high power supply voltage is applied to one of a source and a drain of the transistor 231.

A gate of the transistor 232 is electrically connected to the gate of the transistor 2121 in the current mirror circuit 212 of the reference voltage generation circuit 201. One of a source and a drain of the transistor 232 is electrically connected to the other of the source and the drain of the transistor 231. Moreover, the low power supply voltage is applied to the other of the source and the drain of the transistor 232.

Note that although the amplifier circuits 202 and 203 are not necessarily provided, a stable signal can be generated by the provision of the amplifier circuits 202 and 203.

The arithmetic circuit 204 illustrated in FIG. 4 includes a resistor 241, a current mirror circuit 242, a resistor 243, a transistor 244, a current mirror circuit 245, a transistor 246, a capacitor 247, a transistor 248, and a transistor 249.

The high power supply voltage is applied to a first terminal of the resistor 241. A current depending on a resistance value of the resistor 241 flows between the terminals of the resistor 241.

For the structure of the current mirror circuit 242, any of structures that can be applied to the current mirror circuit 112 in the photoelectric conversion circuit 101 in FIG. 2 can be employed, for example. Further, although the current mirror circuit 242 is not necessarily provided, by the provision of the current mirror circuit 242, a plurality of currents which are the same as the original current (e.g., the current flowing through the resistor 241) or which are obtained by amplifying or attenuating the original current can be generated. A specific structure of the current mirror circuit 242 will be described below.

The current mirror circuit 242 includes a transistor 2421, a transistor 2422, and a transistor 2423.

A gate of the transistor 2421 is electrically connected to one of a source and a drain of the transistor 2421 and the second terminal of the resistor 241. Moreover, the low power supply voltage is applied to the other of the source and the drain of the transistor 2421.

A gate of the transistor 2422 is electrically connected to the gate of the transistor 2421. One of a source and a drain of the transistor 2422 is electrically connected to the transistor 246. The low power supply voltage is applied to the other of the source and the drain of the transistor 2422.

A gate of the transistor 2423 is electrically connected to the gate of the transistor 2421. One of a source and a drain of the transistor 2423 is electrically connected to the transistor 249. The low power supply voltage is applied to the other of the source and the drain of the transistor 2423.

Next, the operation of the current mirror circuit 242 will be described.

First, a current flows between the drain and the source of the transistor 2421 depending on a current flowing through the resistor 241. Further, since a voltage of the gate of the transistor 2421 and a voltage of the gate of the transistor 2422 become equal to each other, a current also flows between the drain and the source of the transistor 2422. Moreover, since the voltage of the gate of the transistor 2421 and a voltage of the gate of the transistor 2423 become equal to each other, a current also flows between the drain and the source of the transistor 2423.

A first terminal of the resistor 243 is electrically connected to the other of the source and the drain of the transistor 231 in the amplifier circuit 203. Note that in the case where the amplifier circuit 203 is not provided, the first terminal of the resistor 243 is electrically connected to one of the source and the drain of the transistor 1122 in the amplifier circuit 112 of the photoelectric conversion circuit 101.

A gate of the transistor 244 is electrically connected to a second terminal of the resistor 243. One of a source and a drain of the transistor 244 is electrically connected to the current mirror circuit 245. The other of the source and the drain of the transistor 244 is electrically connected to one of the source and the drain of the transistor 2422 in the current mirror circuit 242.

For the structure of the current mirror circuit 245, any of structures that can be applied to the current mirror circuit 112 in the photoelectric conversion circuit 101 in FIG. 2 can be employed, for example. The specific structure will be described below.

The current mirror circuit 245 illustrated in FIG. 4 includes a transistor 2451 and a transistor 2452.

The high power supply voltage is applied to one of a source and a drain of the transistor 2451. A gate of the transistor 2451 is electrically connected to the other of the source and the drain of the transistor 2451 and one of the source and the drain of the transistor 244. Note that the transistor 2451 illustrated in FIG. 4 is a p-channel transistor.

A gate of the transistor 2452 is electrically connected to the gate of the transistor 2451. The high power supply voltage is applied to one of a source and a drain of the transistor 2452. Note that the transistor 2452 illustrated in FIG. 4 is a p-channel transistor.

Next, the operation of the current mirror circuit 245 will be described.

First, when the transistor 244 is on, a current flows between the drain and the source of the transistor 2451. Further, since a voltage of the gate of the transistor 2451 and a voltage of the gate of the transistor 2452 become equal to each other, a current also flows between the drain and the source of the transistor 2452.

A gate of the transistor 246 is electrically connected to the other of the source and the drain of the transistor 221 in the amplifier circuit 202. One of a source and a drain of the transistor 246 is electrically connected to the other of the source and the drain of the transistor 2452 in the current mirror circuit 245. The other of the source and the drain of the transistor 246 is electrically connected to the other of the source and the drain of the transistor 244.

The capacitor 247 has a first terminal and a second terminal. The first terminal of the capacitor 247 is electrically connected to one of the source and the drain of the transistor 246.

A gate of the transistor 248 is electrically connected to one of the source and the drain of the transistor 246. The high power supply voltage is applied to one of a source and a drain of the transistor 248. The other of the source and the drain of the transistor 248 is electrically connected to a second terminal of the capacitor 247. Note that the transistor 248 in the arithmetic circuit 204 illustrated in FIG. 4 is a p-channel transistor.

A gate of the transistor 249 is electrically connected to one of a source and a drain of the transistor 249, the other of the source and the drain of the transistor 248, and the second terminal of the capacitor 247.

The output circuit 205 illustrated in FIG. 4 includes a transistor 251, a transistor 252, a current mirror circuit 253, and a current mirror circuit 255.

A gate of the transistor 251 is electrically connected to the second terminal of the capacitor 247 in the arithmetic circuit 204. One of a source and a drain of the transistor 251 is electrically connected to the current mirror circuit 253. The other of the source and the drain of the transistor 251 is electrically connected to the second terminal of the resistor 243 in the arithmetic circuit 204.

A gate of the transistor 252 is electrically connected to the other of the source and the drain of the transistor 249 in the arithmetic circuit 204, and one of a source and a drain of the transistor 252 is electrically connected to the other of the source and the drain of the transistor 251. Moreover, the low power supply voltage is applied to the other of the source and the drain of the transistor 252.

For the current mirror circuit 253, any of structures that can be applied to the current mirror circuit 112 in the photoelectric conversion circuit 101 in FIG. 2 can be employed, for example. The specific structure will be described below.

The current mirror circuit 253 illustrated in FIG. 4 includes a transistor 2531 and a transistor 2532.

A gate of the transistor 2531 is electrically connected to one of the source and the drain of the transistor 251. The high power supply voltage is applied to one of the source and the drain of the transistor 2531. The other of the source and the drain of the transistor 2531 is electrically connected to the gate of the transistor 2531.

A gate of the transistor 2532 is electrically connected to the gate of the transistor 2531. The high power supply voltage is applied to one of the source and the drain of the transistor 2532.

Next, the operation of the current mirror circuit 253 will be described.

When the transistor 251 is on, a current flows between the drain and the source of the transistor 2531. Further, since a potential of the gate of the transistor 2531 and a potential of the gate of the transistor 2532 become equal to each other, a current also flows between the drain and the source of the transistor 2532.

For the structure of the current mirror circuit 255, any of structures that can be applied to the current mirror circuit 112 in FIG. 2 can be employed. The specific structure will be described below.

The current mirror circuit 255 illustrated in FIG. 4 includes a transistor 2551 and a transistor 2552.

A gate of the transistor 2551 is electrically connected to one of a source and a drain of the transistor 2551 and the other of the source and the drain of the transistor 2532. The low power supply voltage is applied to the other of the source and the drain of the transistor 2551.

A gate of the transistor 2552 is electrically connected to the gate of the transistor 2551, and one of a source and a drain of the transistor 2552 is electrically connected to the digital signal generation circuit 103 illustrated in FIG. 1. The low power supply voltage is applied to the other of the source and the drain of the transistor 2552.

Next, the operation of the current mirror circuit 255 will be described.

A current flows between the drain and the source of the transistor 2551 depending on a voltage of the other of the source and the drain of the transistor 2532 in the current mirror circuit 253. Further, since a voltage of the gate of the transistor 2551 and a voltage of the gate of the transistor 2552 become equal to each other, a current also flows between the drain and the source of the transistor 2552.

Figure 5:
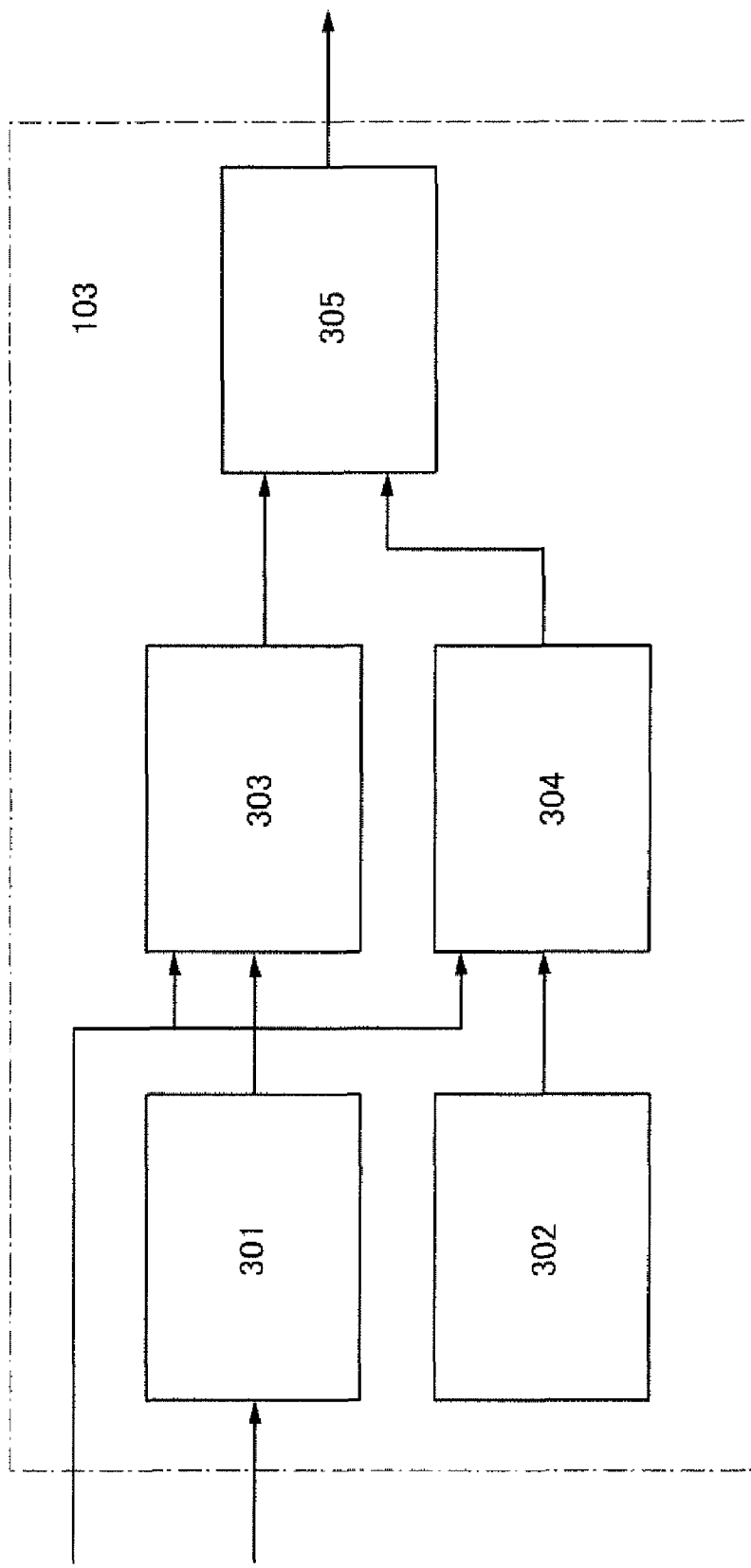
FIG. 5 is a block diagram illustrating an example of a structure of a digital signal generation circuit illustrated in FIG. 1.

Next, a structure of the digital signal generation circuit 103 will be described with reference to FIG. 5. FIG. 5 is a block diagram illustrating an example of a structure of the digital signal generation circuit illustrated in FIG. 1.

The digital signal generation circuit 103 illustrated in FIG. 5 includes a first clock signal generation circuit 301, a second clock signal generation circuit 302, a first counter circuit 303, a second counter circuit 304, and a latch circuit 305.

The first clock signal generation circuit 301 has a function of generating a first clock signal $CLK_1$ that oscillates at a frequency depending on the second current $I_{102}$.

The second clock signal generation circuit 302 has a function of generating a second clock signal $CLK_2$ that oscillates at a predetermined frequency.

The first counter circuit 303 has a function of counting the number of pulses of the first clock signal $CLK_1$ generated in the first clock signal generation circuit 301.

The second counter circuit 304 has a function of setting a period for counting the number of pulses of the first clock signal $CLK_1$ in the first counter circuit 303. Specifically, the second counter circuit 304 has functions of counting the number of pulses of the second clock signal $CLK_2$ generated in the second clock signal generation circuit 302 and setting a period for counting the number of pulses of the first clock signal $CLK_1$ in accordance with the count value (also referred to as a count value $CNT_2$).

The latch circuit 305 has a function of holding a count value $CNT_1$ of the first counter circuit 303 as data. The held data is a digital signal.

Each of the first clock signal generation circuit 301 and the second clock signal generation circuit 302 can be constituted by a functional circuit, for example. An example of structures of the first clock signal generation circuit 301 and the second clock signal generation circuit 302 will be described below.

Figure 6:
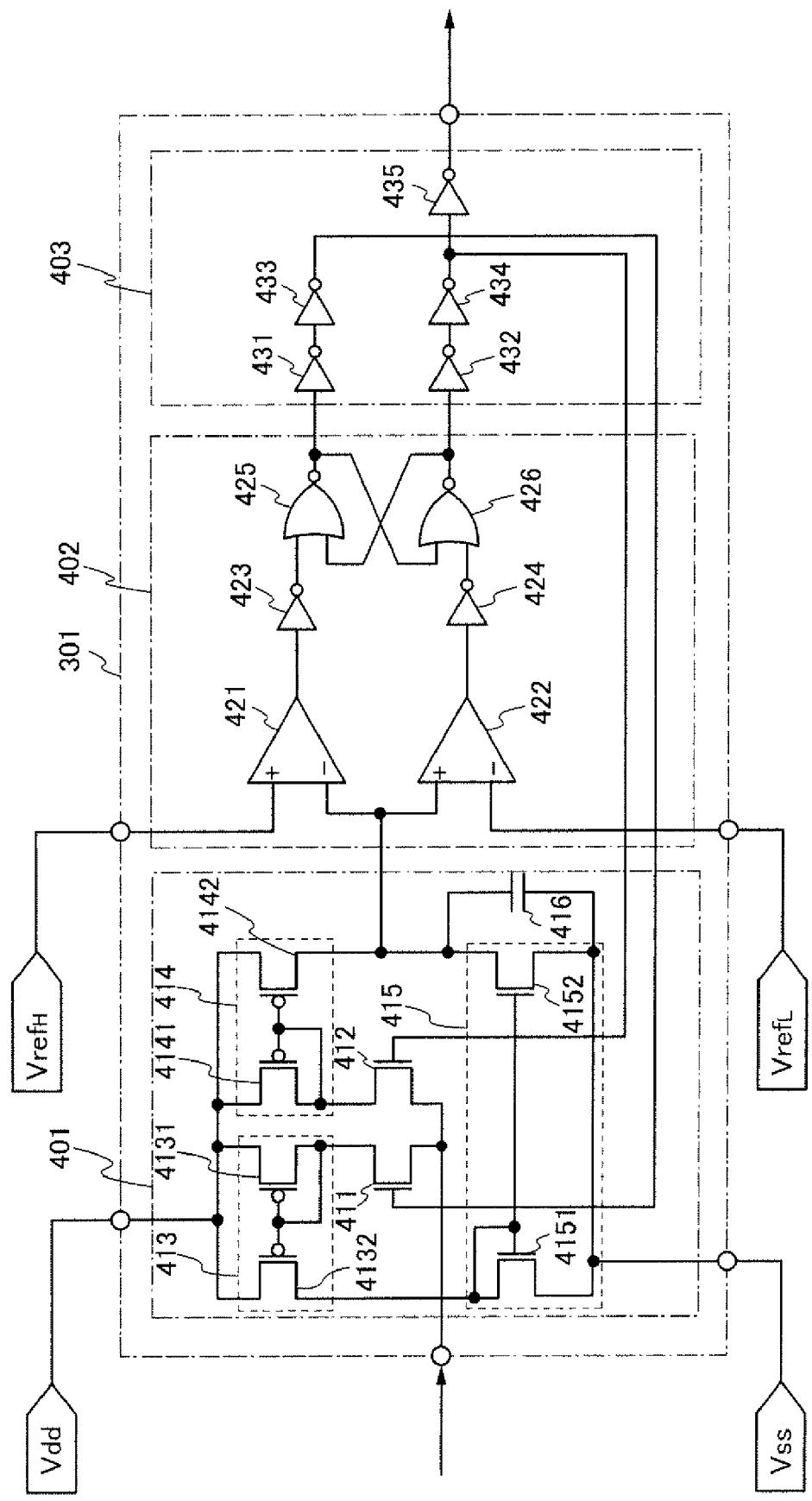
FIG. 6 is a circuit diagram illustrating an example of a structure of a first clock signal generation circuit illustrated in FIG. 5.

An example of the structure of the first clock signal generation circuit 301 is illustrated in FIG. 6. FIG. 6 is a circuit diagram illustrating an example of a structure of the first clock signal generation circuit in the photodetector illustrated in FIG. 5.

The first clock signal generation circuit 301 illustrated in FIG. 6 includes a ramp wave signal generation circuit 401, a waveform shaping circuit 402, and a buffer circuit 403.

The ramp wave signal generation circuit 401 has a function of generating a ramp signal (also referred to as a ramp wave signal) depending on the second current $I_{102}$. A ramp wave has a waveform in which an output voltage is linear for a certain period. The specific structure is described below.

The ramp wave signal generation circuit 401 illustrated in FIG. 6 includes a transistor 411, a transistor 412, a current mirror circuit 413, a current mirror circuit 414, a current mirror circuit 415, and a capacitor 416.

A gate of the transistor 411 is electrically connected to the buffer circuit 403, and one of a source and a drain of the transistor 411 is electrically connected to the current mirror circuit 413.

A gate of the transistor 412 is electrically connected to the buffer circuit 403, one of a source and a drain thereof is electrically connected to the current mirror circuit 414, and the other of the source and the drain thereof is electrically connected to the other of the source and the drain of the transistor 411.

For the structure of the current mirror circuit 413, any of structures that can be applied to the current mirror circuit 112 in the photoelectric conversion circuit 101 in FIG. 2 can be employed. The specific structure will be described below.

The current mirror circuit 413 includes a transistor 4131 and a transistor 4132. Note that in the current mirror circuit 413 illustrated in FIG. 6, the transistor 4131 is a p-channel transistor.

A gate of the transistor 4131 is electrically connected to one of the source and the drain of the transistor 411. The high power supply voltage is applied to one of a source and a drain of the transistor 4131. The other of the source and the drain of the transistor 4131 is electrically connected to the gate of the transistor 4131.

A gate of the transistor 4132 is electrically connected to the gate of the transistor 4131. The high power supply voltage is applied to one of a source and a drain of the transistor 4132. The other of the source and the drain of the transistor 4132 is electrically connected to the current mirror circuit 415.

For the structure of the current mirror circuit 414, any of structures that can be applied to the current mirror circuit 112 in the photoelectric conversion circuit 101 in FIG. 2 can be employed. The specific structure will be described below.

The current mirror circuit 414 illustrated in FIG. 6 includes a transistor 4141 and a transistor 4142.

A gate of the transistor 4141 is electrically connected to one of the source and the drain of the transistor 412. The high power supply voltage is applied to one of a source and a drain of the transistor 4141. The other of the source and the drain of the transistor 4141 is electrically connected to the gate of the transistor 4141.

A gate of the transistor 4142 is electrically connected to the gate of the transistor 4141. The high power supply voltage is applied to one of a source and a drain of the transistor 4142. The other of the source and the drain of the transistor 4142 is electrically connected to the waveform shaping circuit 402.

For the structure of the current mirror circuit 415, any of structures that can be applied to the current mirror circuit 112 in the photoelectric conversion circuit 101 in FIG. 2 can be employed. The specific structure will be described below.

The current mirror circuit 415 illustrated in FIG. 6 includes a transistor 4151 and a transistor 4152.

A gate of the transistor 4151 is electrically connected to one of a source and a drain of the transistor 4151 and the other of the source and the drain of the transistor 4131 in the current mirror circuit 413. The low power supply voltage is applied to the other of the source and the drain of the transistor 4151.

A gate of the transistor 4152 is electrically connected to the gate of the transistor 4151. One of a source and a drain of the transistor 4152 is electrically connected to the other of the source and the drain of the transistor 4142 in the current mirror circuit 414. The low power supply voltage is applied to the other of the source and the drain of the transistor 4152.

The capacitor 416 has a first terminal and a second terminal. The first terminal of the capacitor 416 is electrically connected to the other of the source and the drain of the transistor 4142 in the current mirror circuit 414. Moreover, the low power supply voltage is applied to the second terminal of the capacitor 416.

The waveform shaping circuit 402 includes a comparator 421, a comparator 422, an inverter 423, an inverter 424, an NOR circuit 425, and an NOR circuit 426.

An inverting input terminal of the comparator 421 is electrically connected to the first terminal of the capacitor 416 in the ramp wave signal generation circuit 401. Moreover, a first reference voltage $Vref_H$ is applied to a non-inverting input terminal of the comparator 421. The first reference voltage $Vref_H$ is represented by the following formula.

$$Vref_H > \frac{|Vdd| - |Vss|}{2} \qquad \text{[Formula 1]}$$

A non-inverting input terminal of the comparator 422 is electrically connected to the inverting input terminal of the comparator 421. Moreover, a second reference voltage $Vref_L$ is applied to an inverting input terminal of the comparator 422. The second reference voltage $Vref_L$ is represented by the following formula.

$$Vref_L < \frac{|Vdd| - |Vss|}{2} \qquad \text{[Formula 2]}$$

An input terminal of the inverter 423 is electrically connected to an output terminal of the comparator 421.

An input terminal of the inverter 424 is electrically connected to an output terminal of the comparator 422.

A first input terminal of the NOR circuit 425 is electrically connected to an output terminal of the inverter 423.

A first input terminal of the NOR circuit 426 is electrically connected to an output terminal of the NOR circuit 425, a second input terminal thereof is electrically connected to an output terminal of the inverter 424, and an output terminal thereof is electrically connected to a second input terminal of the NOR circuit 425.

The buffer circuit 403 includes an inverter 431, an inverter 432, an inverter 433, an inverter 434, and an inverter 435.

An input terminal of the inverter 431 is electrically connected to the output terminal of the NOR circuit 425 in the waveform shaping circuit 402.

An input terminal of the inverter 432 is electrically connected to the output terminal of the NOR circuit 426 in the waveform shaping circuit 402.

An input terminal of the inverter 433 is electrically connected to an output terminal of the inverter 431, and an output terminal thereof is electrically connected to the gate of the transistor 411 in the ramp wave signal generation circuit 401.

An input terminal of the inverter 434 is electrically connected to an output terminal of the inverter 432, and an output terminal thereof is electrically connected to the gate of the transistor 412 in the ramp wave signal generation circuit 401.

An input terminal of the inverter 435 is electrically connected to the output terminal of the inverter 434.

Figure 7:
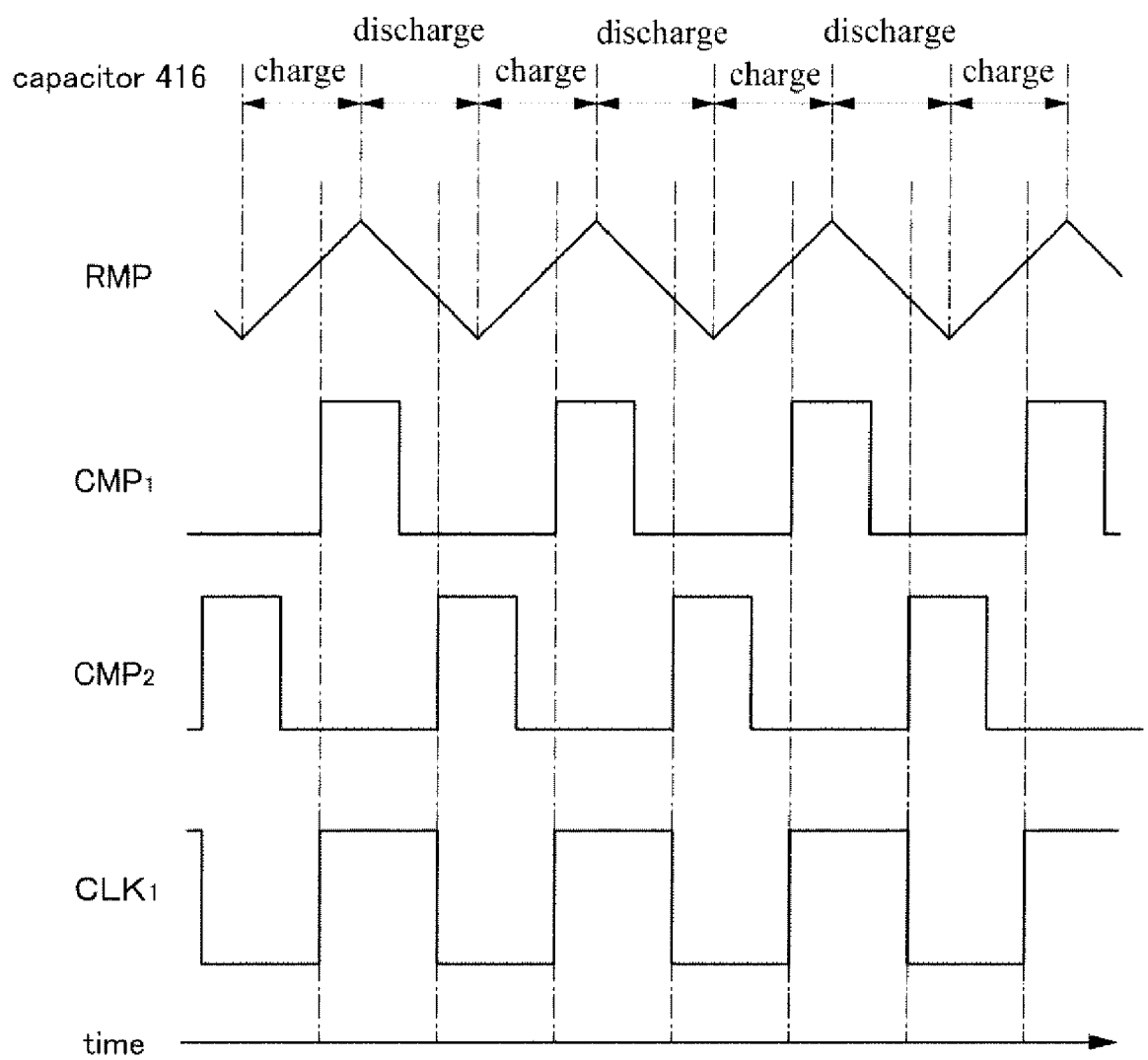
FIG. 7 is a timing chart illustrating an example of operation of a first clock signal generation circuit illustrated in FIG. 6.

Next, the operation of the first clock signal generation circuit 301 illustrated in FIG. 6 will be described with reference to FIG. 7. FIG. 7 is a timing chart illustrating an example of the operation of the first clock signal generation circuit illustrated in FIG. 6.

First, in the ramp wave signal generation circuit 401, the capacitor 416 is repeatedly charged and discharged depending on the second current $I_{102}$ generated in the temperature compensation circuit 102, so that a ramp wave signal RMP is generated. At this time, a frequency $f_{RMP}$ of the ramp wave signal RMP is represented by Formula 3 using the second current $I_{102}$, a capacitance C of the capacitor 416, the first reference voltage $Vref_H$, and the second reference voltage $Vref_L$. The ramp wave signal RMP generated is output to the waveform shaping circuit 402.

$$f_{RMP} = \frac{1}{T} = \frac{I_{102}}{C(|Vref_H| - |Vref_L|)} \qquad \text{[Formula 3]}$$

Since the second current $I_{102}$ is proportional to the photocurrent $I_L$ generated in the photoelectric conversion element 111, the frequency $f_{RMP}$ of the ramp wave signal RMP is proportional to the photocurrent $I_L$. Therefore, the relation between the frequency $f_{RMP}$ and the photocurrent $I_L$ can be represented by Formula 4. In Formula 4, Z is a proportional constant, which is a constant determined by the amplification factor of the amplifier circuit 202, electric characteristics of the transistors included in the ramp wave signal generation circuit 401, or the like.

$$f_{RMP} = \frac{1}{T} = Z \frac{I_L}{C(|Vref_H| - |Vref_L|)} \qquad \text{[Formula 4]}$$

Further, the ramp wave signal RMP generated is output to the comparators 421 and 422 in the waveform shaping circuit 402. In the comparator 421, an output signal $CMP_1$ is generated in accordance with the comparison result between the ramp wave signal RMP and the first reference voltage $Vref_H$. Moreover, the output signal $CMP_1$ is held in the NOR circuits 425 and 426 for a certain period, so that the ramp wave signal RMP is shaped into a square wave signal.

Moreover, a clock signal is generated in the buffer circuit 403 based on the square wave signal. The clock signal generated at this time is output to the first counter circuit 303 as the first clock signal $CLK_1$. The frequency of the first clock signal CLK₁ is equal to the frequency of the ramp wave signal RMP. In other words, the first clock signal $CLK_1$ which oscillates at a frequency proportional to the photocurrent $I_L$ generated in the photoelectric conversion circuit 101 as shown by Formula 4 is output from the buffer circuit 403. The above is the operation in the first clock signal generation circuit 301 illustrated in FIG. 7.

Next, an example of a structure of the second clock signal generation circuit 302 will be described.

Figure 8:
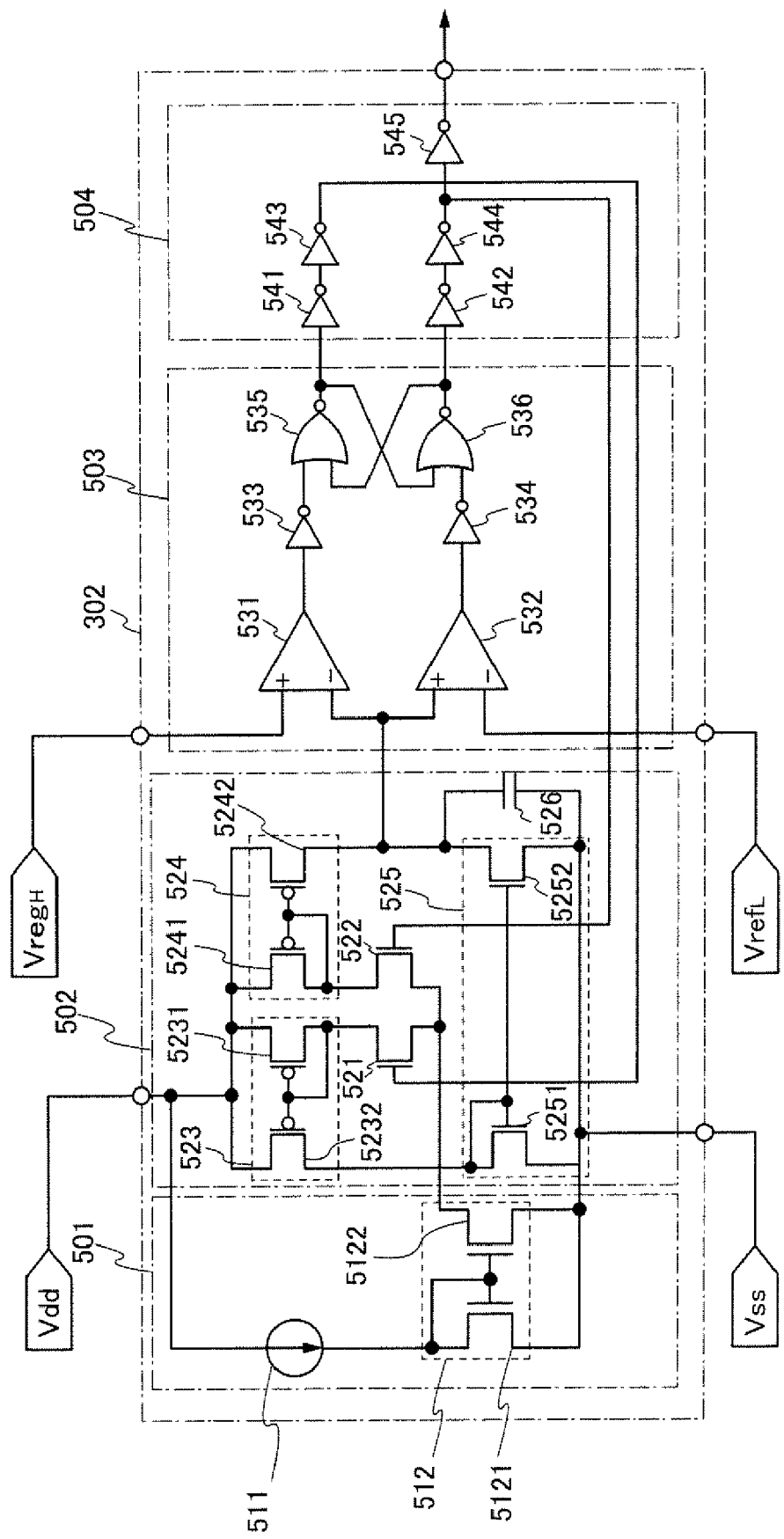
FIG. 8 is a circuit diagram illustrating a structure of a second clock signal generation circuit illustrated in FIG. 5.

An example of the structure of the second clock signal generation circuit 302 is illustrated in FIG. 8. FIG. 8 is a circuit diagram illustrating an example of the structure of the second clock signal generation circuit 302 illustrated in FIG. 5.

The second clock signal generation circuit 302 illustrated in FIG. 8 includes a constant current circuit 501, a ramp wave signal generation circuit 502, a waveform shaping circuit 503, and a buffer circuit 504.

The constant current circuit 501 has a function of generating a current with a constant value. An example of a specific structure thereof will be described below.

The constant current circuit 501 illustrated in FIG. 8 includes a current source 511 and a current mirror circuit 512.

The current source 511 has a first terminal and a second terminal, and has a function of generating a constant current which is a current with a constant value. The high power supply voltage is applied to the first terminal of the current source 511.

For the structure of the current mirror circuit 512, any of structures that can be applied to the current mirror circuit 112 in FIG. 2 can be employed. The specific structure will be described below.

The current mirror circuit 512 includes a transistor 5121 and a transistor 5122.

A gate of the transistor 5121 is electrically connected to one of a source and a drain of the transistor 5121 and a second terminal of the current source 511. The low power supply voltage is applied to the other of the source and the drain of the transistor 5121.

A gate of the transistor 5122 is electrically connected to the gate of the transistor 5121, and one of a source and a drain of the transistor 5122 is electrically connected to the ramp wave signal generation circuit 502. The low power supply voltage is applied to the other of the source and the drain of the transistor 5122.

Note that although the current mirror circuit 512 is not necessarily provided, by the provision of the current mirror circuit 512, a plurality of currents which are the same as the original current (e.g., a current flowing through the current source 511) or which are obtained by amplifying or attenuating the original current can be generated.

The ramp wave signal generation circuit 502 is similar in function to the ramp wave signal generation circuit 401 in FIG. 6. The specific structure will be described below.

The ramp wave signal generation circuit 502 illustrated in FIG. 8 includes a transistor 521, a transistor 522, a current mirror circuit 523, a current mirror circuit 524, a current mirror circuit 525 and a capacitor 526.

A gate of the transistor 521 is electrically connected to the buffer circuit 504, one of a source and a drain thereof is electrically connected to the current mirror circuit 523, and the other of the source and the drain thereof is electrically connected to one of the source and the drain of the transistor 5122 in the current mirror circuit 512 of the constant current circuit 501.

A gate of the transistor 522 is electrically connected to the buffer circuit 504, one of a source and a drain thereof is electrically connected to the current mirror circuit 524, and the other of the source and the drain thereof is electrically connected to the other of the source and the drain of the transistor 521.

For the structure of the current mirror circuit 523, any of structures that can be applied to the current mirror circuit 112 in the photoelectric conversion circuit 101 illustrated in FIG. 2 can be employed. The specific structure will be described below.

The current mirror circuit 523 includes a transistor 5231 and a transistor 5232. The transistor 5231 corresponds to the transistor 4131 in the current mirror circuit 413 in FIG. 6, and the transistor 5232 corresponds to the transistor 4132 in the current mirror circuit 413 in FIG. 6; therefore, the description of the transistors 4131 and 4132 is employed as appropriate for the specific structure.

For the current mirror circuit 524, any of structures that can be applied to the current mirror circuit 112 in the photoelectric conversion circuit 101 illustrated in FIG. 2 can be employed. The specific structure will be described below.

The current mirror circuit 524 illustrated in FIG. 8 includes a transistor 5241 and a transistor 5242.

The transistor 5241 corresponds to the transistor 4141 in the current mirror circuit 414 in FIG. 6, and the transistor 5242 corresponds to the transistor 4142 in the current mirror circuit 414 in FIG. 6; therefore, the description of the transistors 4141 and 4142 is employed as appropriate for the specific structure.

For the structure of the current mirror circuit 525, any of structures that can be applied to the current mirror circuit 112 in the photoelectric conversion circuit 101 illustrated in FIG. 2 can be employed. The specific structure will be described below.

The current mirror circuit 525 illustrated in FIG. 8 includes a transistor 5251 and a transistor 5252.

The transistor 5251 corresponds to the transistor 4151 in the current mirror circuit 415 in FIG. 6, and the transistor 5252 corresponds to the transistor 4152 in the current mirror circuit 415 in FIG. 6; therefore, the description of the transistors 4151 and 4152 is employed as appropriate for the specific structure.

Since the capacitor 526 corresponds to the capacitor 416 illustrated in FIG. 6, the description of the capacitor 416 is employed as appropriate for the specific structure.

The waveform shaping circuit 503 includes a comparator 531, a comparator 532, an inverter 533, an inverter 534, an NOR circuit 535, and an NOR circuit 536.

The waveform shaping circuit 503 corresponds to the waveform shaping circuit 402 illustrated in FIG. 6; the comparator 531, the comparator 421; the comparator 532, the comparator 422; the inverter 533, the inverter 423; the inverter 534, the inverter 424; the NOR circuit 535, the NOR circuit 425; and the NOR circuit 536, the NOR circuit 426. Therefore, the description of the waveform shaping circuit 402 is employed as appropriate for a specific structure of the waveform shaping circuit 503.

The buffer circuit 504 includes an inverter 541, an inverter 542, an inverter 543, an inverter 544, and an inverter 545. The buffer circuit 504 corresponds to the buffer circuit 403 illustrated in FIG. 6; the inverter 541, the inverter 431; the inverter 542, the inverter 432; the inverter 543, the inverter 433; the inverter 544, the inverter 434; and the inverter 545, the inverter 435. Therefore, the description of the buffer circuit 403 is employed as appropriate for a specific structure of the buffer circuit 504.

Next, the operation of the second clock signal generation circuit 302 illustrated in FIG. 8 will be described.

First, in the constant current circuit 501, a current is generated in such a manner that a current generated by the current source 511 is amplified or attenuated by the current mirror circuit 512, and the amplified or attenuated current flows into the ramp wave signal generation circuit 502.

In the ramp wave signal generation circuit 502, the capacitor 526 is repeatedly charged and discharged depending on the current generated by the constant current circuit 501, so that the ramp wave signal RMP is generated. Since the specific operation of the ramp wave signal generation circuit 502 is similar to that of the ramp wave signal generation circuit 401 illustrated in FIG. 6, the description of the ramp wave signal generation circuit 401 is employed as appropriate.

Further, the ramp wave signal RMP is shaped in the waveform shaping circuit 503, so that a square wave signal is formed. Since the specific operation of the waveform shaping circuit 503 is the same as that of the waveform shaping circuit 402 illustrated in FIG. 6, the description of the waveform shaping circuit 402 is employed as appropriate.

Moreover, the square wave signal is output to the buffer circuit 504, and a clock signal is generated in the buffer circuit 504. The clock signal generated at this time is output to the second counter circuit 304 in FIG. 5 as the second clock signal $CLK_2$. Note that since the specific operation of the buffer circuit 504 is the same as that of the buffer circuit 403, the description of the buffer circuit 403 is employed as appropriate.

The second clock signal $CLK_2$ can be generated as described above.

Next, an example of the operation in the photodetector in this embodiment will be described.

First, the operation of the photoelectric conversion circuit 101 illustrated in FIG. 2 will be described.

In the photoelectric conversion circuit 101 illustrated in FIG. 2, when light enters the photoelectric conversion element 111, the photocurrent $I_L$ is generated in the photoelectric conversion element 111 in accordance with the illuminance of incident light, and a current flows between the drain and the source of the transistor 1122 in the current mirror circuit 112 depending on the photocurrent $I_L$. Further, the current flowing between the drain and the source of the transistor 1122 is converted into a log-compressed voltage by the diode 113. The log-compressed voltage is represented as the first voltage $V_{101}$. A value of the first voltage $V_{101}$ can be obtained as follows.

First, voltage-current characteristics of the diode 113 are represented by Formula 5.

$$I_{113} = I_S \exp\left(\frac{qV_{113}}{kT} - 1\right) \quad \text{[Formula 5]}$$

$I_{113}$ represents a current flowing through the diode 113. A voltage $V_{113}$ of the opposite terminals of the diode 113 is a voltage induced when a current flows through the diode 113.

Note that for simplification, description is made on the assumption that a value of the current flowing between the drain and the source of the transistor 1121 and a value of the current flowing between the drain and the source of the transistor 1122 are the same.

In Formula 5, Is represents reverse saturation current; q, elementary electric charge [C]; k, Boltzmann constant [J·K⁻¹]; and T, temperature [K]. Note that the reverse saturation current Is is a function including a term of the temperature, and is represented by Formula 6.

$$I_S = A\exp\left(\frac{-E_g}{kT}\right) \quad \text{[Formula 6]}$$

In Formula 6, A is a constant, and $E_g$ is band gap energy [J].
When $qV_{113}/kT$ is sufficiently larger than 1 in Formula 5 and Formula 5 is solved for $V_{113}$, Formula 7 is obtained.

$$V_{113} = \frac{kT}{q}\left(\ln\left(\frac{I_{113}}{I_S}\right) - 1\right) \approx \frac{kT}{q}\ln\left(\frac{I_{113}}{I_S}\right)\left(\frac{I_{113}}{I_S} \gg 1\right) \quad \text{[Formula 7]}$$

Moreover, the first voltage $V_{101}$ is represented by Formula 8.

$$V_{101} = Vdd - V_{113} \quad \text{[Formula 8]}$$

Further, when the current mirror circuit 112 is provided, $I_{113}$ can be represented by Formula 9.

$$I_{113} = I_L \times n \quad \text{[Formula 9]}$$

In Formula 9, $I_L$ represents a photocurrent of the photoelectric conversion element 111, and n represents an amplification factor of the current mirror circuit 112.

As described above, a value of the first voltage $V_{101}$ generated in the photoelectric conversion circuit 101 is proportional to a value of a log-compressed photocurrent $I_L$. The above is the operation in the photoelectric conversion circuit 101.

Next, the operation in the temperature compensation circuit 102 will be described.

The reference voltage $Vref_{201}$ is generated in the reference voltage generation circuit 201. Specifically, a current flows between the drain and the source of the transistor 2122 in the current mirror circuit 212 depending on a current flowing through the resistor 211. Moreover, the current flowing between the drain and the source of the transistor 2122 is converted into a log-compressed voltage by the diode 213. The voltage that is logarithmically compressed at this time is the reference voltage $Vref_{201}$. The reference voltage $Vref_{201}$ can be obtained as follows.

First, voltage-current characteristics of the diode 213 are represented by Formula 10.

$$I_{213} = I_S \exp\left(\frac{qV_{213}}{kT} - 1\right) \quad \text{[Formula 10]}$$

Note that for simplification, description is made on the assumption that a value of the current flowing between the drain and the source of the transistor 2121 and a value of the current flowing between the drain and the source of the transistor 2122 are the same.

In Formula 10, Is represents reverse saturation current; q, elementary electric charge [C]; k, Boltzmann constant [J·K⁻¹]; and T, temperature [K]. Note that the reverse saturation current Is is a function including a term of the temperature, and is represented by Formula 6.

When $qV_{213}/kT$ is sufficiently larger than 1 in Formula 10 and Formula 10 is solved for $V_{213}$, Formula 11 is obtained.

$$V_{213} = \frac{kT}{q}\left(\ln\left(\frac{I_{213}}{I_S}\right) - 1\right) \approx \frac{kT}{q}\ln\left(\frac{I_{213}}{I_S}\right)\left(\frac{I_{213}}{I_S} \gg 1\right) \quad \text{[Formula 11]}$$

Moreover, the reference voltage $Vref_{201}$ is represented by Formula 12.

$$Vref_{201} = Vdd - V_{213} \quad \text{[Formula 12]}$$

Further, when the current mirror circuit 112 is provided, $I_{113}$ can be represented by Formula 13.

$$I_{113} = I_{211} \times m \quad \text{[Formula 13]}$$

In Formula 13, $I_{211}$ represents a current flowing through the resistor 211, and m represents an amplification factor of the current mirror circuit 212.

As described above, a value of the reference voltage $Vref_{201}$ is proportional to a value of a log-compressed value of the current flowing through the resistor 211.

The reference voltage $Vref_{201}$ generated in the reference voltage generation circuit 201 is amplified by the amplifier circuit 202. Specifically, a voltage of the gate of the transistor 221 becomes equal to the reference voltage $Vref_{201}$, and depending on the voltage of the gate of the transistor 221, a voltage of the other of the source and the drain of the transistor 221 becomes a value obtained by subtracting the voltage applied between the gate and the drain of the transistor 221 from the reference voltage $Vref_{201}$, that is, $(Vref_{201} - Vgs_{221})$. At this time, the voltage of the other of the source and the drain of the transistor 221 is represented as an amplified reference voltage $Vref_{201}$.

The first voltage $V_{101}$ generated in the photoelectric conversion circuit 101 is amplified by the amplifier circuit 203. Specifically, a voltage of the gate of the transistor 231 becomes equal to the first voltage $V_{101}$, and depending on the voltage of the gate of the transistor 231, a voltage of the other of the source and the drain of the transistor 231 becomes a value obtained by subtracting the voltage applied between the gate and the drain of the transistor 231 from the first voltage $V_{101}$, that is, $(V_{101} - Vgs_{231})$. At this time, the voltage of the other of the source and the drain of the transistor 231 is represented as an amplified first voltage $V_{101}$.

Further, in the arithmetic circuit 204, the second voltage $V_{102}$ is generated depending on the difference between the first voltage $V_{101}$ and the reference voltage $Vref_{201}$. Specifically, in the arithmetic circuit 204, a voltage of the gate of the transistor 246 becomes equal to the reference voltage $Vref_{201}$ amplified by the amplifier circuit 202. Moreover, a voltage of the gate of the transistor 244 becomes equal to the voltage of the gate of the transistor 246 by the arithmetic circuit 204. Note that in some cases, the voltage of the gate of the transistor 244 is not exactly equal to the voltage of the gate of the transistor 246 depending on characteristics of the arithmetic circuit 204. In addition, description is made below on the assumption that the voltage of the gate of the transistor 244 becomes equal to the voltage of the gate of the transistor 246.

Through the above, a voltage of the difference between the voltage of the gate of the transistor 244 and the reference voltage $Vref_{201}$ amplified by the amplifier circuit 203 is applied to the resistor 243. Therefore, a value obtained by dividing the voltage applied to the resistor 243 by a resistance value of the resistor 243 is a current flowing through the resistor 243.

Here, when the transistor 251 is on and the transistor 252 is off the current flowing through the resistor 243 is equal to a current flowing through the sources and the drains of the transistors 2531 and 251. Strictly, the current flowing through the resistor 243 is a current obtained by subtracting the off current between the drain and the source of the transistor 252 from the current flowing between the drain and the source of the transistor 2531.

On the other hand, when the transistor 251 is off and the transistor 252 is on, the current flowing through the resistor 243 is equal to a current flowing through the source and the drain of the transistor 252. Strictly, the current flowing through the resistor 243 is a current obtained by subtracting the off current between the drain and the source of the transistor 251 from the current flowing between the drain and the source of the transistor 252.

When the transistor 251 is on and the transistor 252 is off, a current flowing through the transistor 2531 is amplified by the amplifier circuit 253, and a current occurs between the drain and the source of the transistor 2532.

The current flowing between the drain and the source of the transistor 2532 flows between the drain and the source of the transistor 2551, and the current is amplified by the current mirror circuit 255, whereby a current occurs between the drain and the source of the transistor 2552. Hereinafter, this current is referred to as the second current $I_{102}$.

When the transistor 251 is off and the transistor 252 is on, a current does not flow through the transistor 2531, and a current does not occur between the drain and the source of the transistor 2532.

The transistor 244 is turned on in accordance with the voltage of the gate. When the transistor 244 is on, a current flows between the drain and the source of the transistor 244, and a current also flows between the drain and the source of the transistor 2451 in the current mirror circuit 245. Further, since the voltage of the gate of the transistor 2451 and the voltage of the gate of the transistor 2452 become equal to each other, a current also flows between the drain and the source of the transistor 2452.

The transistor 246 is turned on in accordance with the voltage of the gate. When the transistor 246 is on, a current flows between the drain and the source of the transistor 246. At this time, a voltage of one of the source and the drain of the transistor 246 depends on the current flowing between the drain and the source of the transistor 246. Moreover, the amount of electric charge depending on the voltage of one of the source and the drain of the transistor 246 is stored in the capacitor 247.

Further, a voltage of the gate of the transistor 248 becomes equal to the voltage of one of the source and the drain of the transistor 246. The transistor 248 is turned on in accordance with the voltage of the gate. A voltage of the other of the source and the drain of the transistor 248 at the time when the transistor 248 is on is represented as the second voltage $V_{102}$. Moreover, a voltage of the other of the source and the drain of the transistor 249 is a value obtained by subtracting the voltage $Vgs_{249}$ between the gate and the source of the transistor 249 from the voltage of the other of the source and the drain of the transistor 248, that is, $(V_{102} - Vgs_{249})$.

In addition, in the temperature compensation circuit 102, the second voltage $V_{102}$ is converted into a current by the output circuit 205 to generate the second current $I_{102}$. The specific operation will be described below.

A voltage of the gate of the transistor 251 becomes equal to the second voltage $V_{102}$, and a voltage of the gate of the transistor 252 becomes equal to $(V_{102} - Vgs_{249})$. At this time, one of the transistor 251 and the transistor 252 is turned on and the other is turned off depending on the voltages of the gates. Each case will be described below.

When the transistor 251 is on and the transistor 252 is off, a current flows between the drain and the source of the transistor 251 depending on the voltage of the gate of the transistor 251, and further, a current flows between the drain and the source of the transistor 2532 in the current mirror circuit 253 depending on the current flowing between the drain and the source of the transistor 251. The current flowing between the drain and the source of the transistor 2532 at this time depends on the amount of first current $I_{101}$, that is, the illuminance of light entering the photoelectric conversion circuit 101.

Moreover, a current flows between the drain and the source of the transistor 2552 depending on a voltage of the other of the source and the drain of the transistor 2532. The current flowing through the transistor 2552 is represented as the second current $I_{102}$.

Further, when the current flows between the drain and the source of the transistor 251, in the arithmetic circuit 204, a current depending on the resistor 243 flows, and the voltage of the gate of the transistor 244 is changed. Accordingly, the voltage of the gate of the transistor 244 can be compensated by the amount of offset of the arithmetic circuit 204.

On the other hand, when the transistor 251 is off and the transistor 252 is on, a current flows between the drain and the source of the transistor 252 depending on the voltage of the gate of the transistor 252. However, no current flows into the current mirror circuit 253, and thus, no current flows into the current mirror circuit 255.

Figure 9:
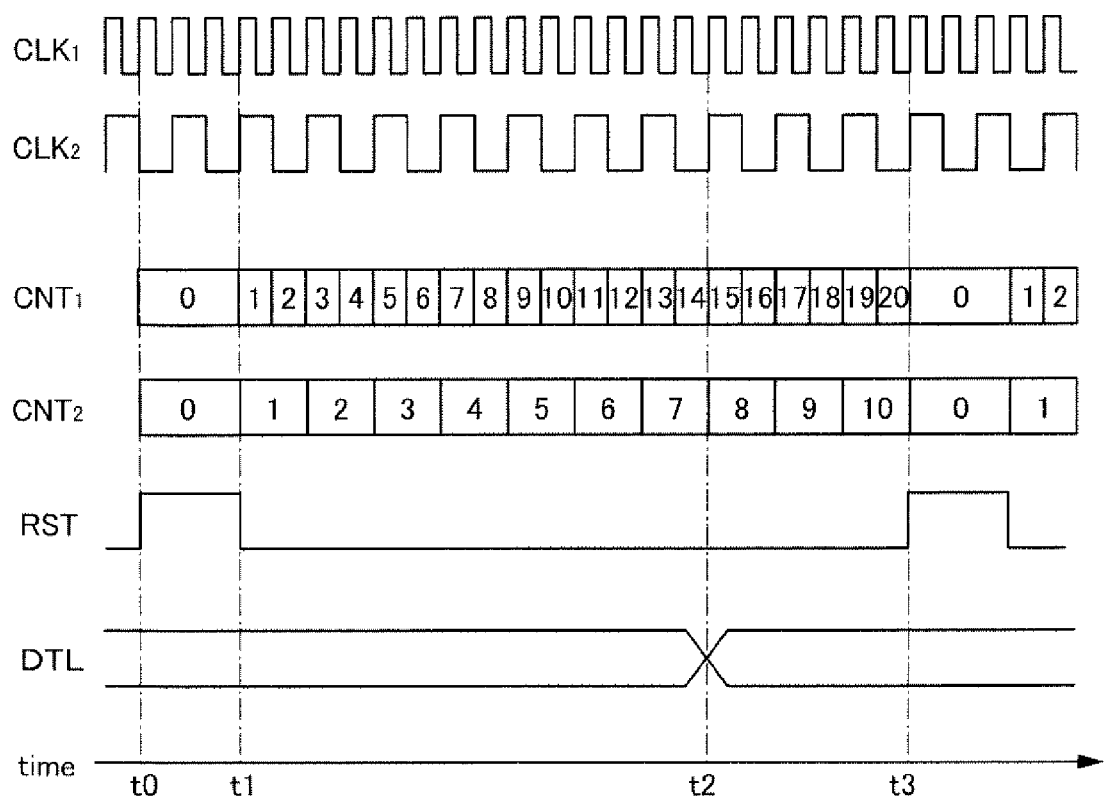
FIG. 9 is a timing chart illustrating operation of a digital signal generation circuit illustrated in FIG. 1.

Next, the operation in the digital signal generation circuit 103 illustrated in FIG. 1 will be described with reference to FIG. 9. FIG. 9 is a timing chart illustrating the operation of the digital signal generation circuit illustrated in FIG. 1.

The first clock signal $CLK_1$ generated in the first clock signal generation circuit 301 has a frequency depending on the second current $I_{102}$ generated in the temperature compensation circuit 102. When the frequency of the first clock signal $CLK_1$ is denoted by $f_{301}$, $f_{301}=Z_1 \times I_{102}$ ($Z_1$ is a proportional constant) is satisfied.

The second clock signal $CLK_2$ generated in the second clock signal generation circuit 302 functions as a reference clock signal. When a constant current is denoted by Ic and the frequency of the second clock signal $CLK_2$ is denoted by $f_{302}$, $f_{302}=Z_2 \times Ic$ ($Z_2$ is a proportional constant) is satisfied.

In a period to, a reset signal RST becomes high, so that the first count value $CNT_1$ of the first counter circuit 303 and the second count value $CNT_2$ of the second counter circuit 304 are reset and become 0.

Next, in a period $t_1$, the reset signal RST becomes low, and the number of pulses of the first clock signal $CLK_1$ starts to be counted in the first counter circuit 303, and the number of pulses of the second clock signal $CLK_2$ starts to be counted in the second counter circuit 304.

Then, in a period $t_2$ where the second count value $CNT_2$ becomes a predetermined value, data of the first count value $CNT_1$ from the period $t_1$ to the period $t_2$ is held in the latch circuit 305 as a digital signal DTL. In the timing chart illustrated in FIG. 9, as an example, the timing is set so that the first count value $CNT_1$ at the time when the second count value $CNT_2$ becomes 8, that is, the data of 15 is held in the latch circuit 305 as the digital signal DTL; however, one embodiment of the present invention is not limited thereto and the timing is set at another count value.

Further, in a period $t_3$, the reset signal RST becomes high, so that the first count value $CNT_1$ and the second count value $CNT_2$ are reset again and become 0. The above is the operation in the digital signal generation circuit 103.

Figure 10:
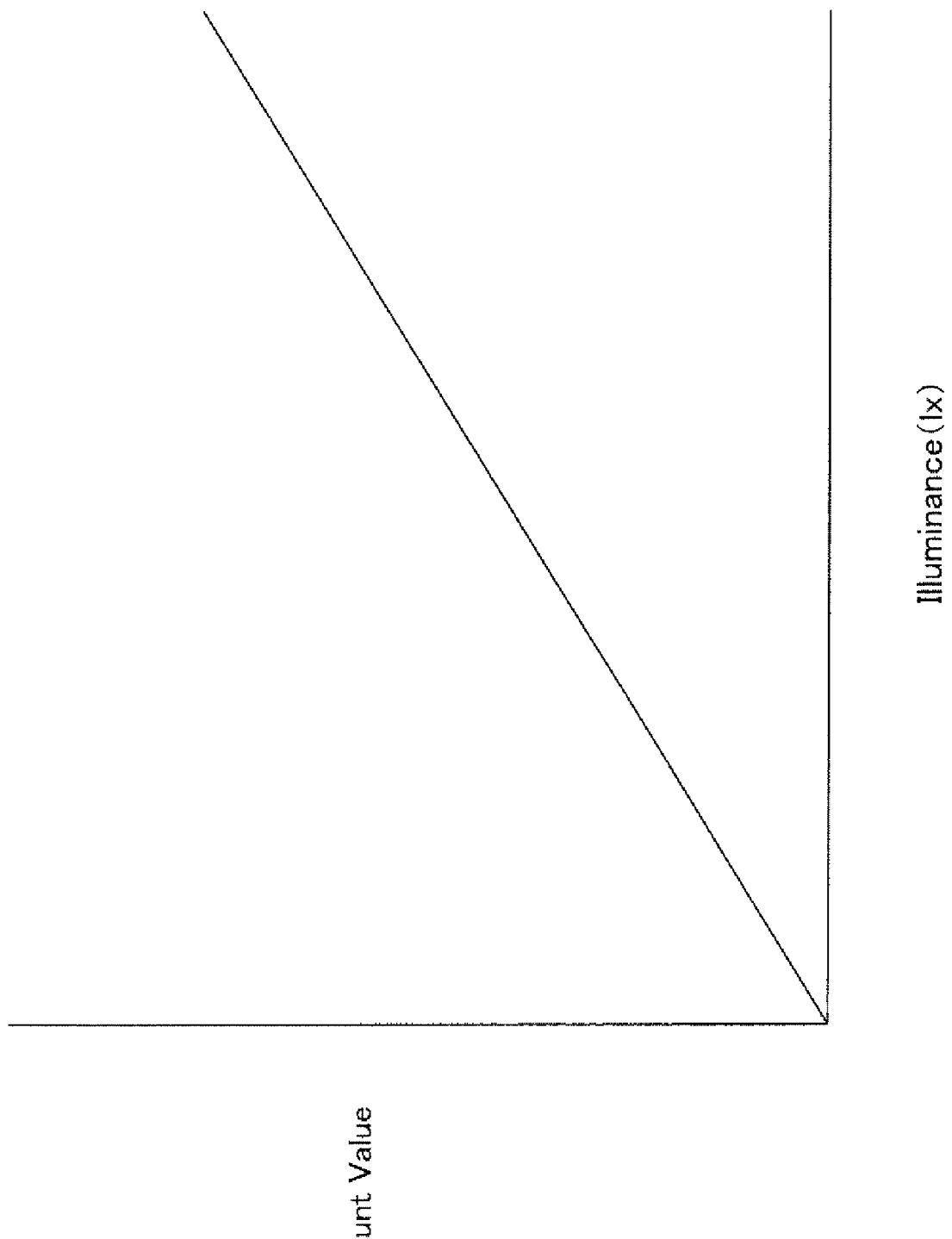
FIG. 10 illustrates a relation between illuminance and a count value in a first counter circuit illustrated in FIG. 3.

Here, the relation between the illuminance and the count value of the first counter circuit 303 is described with reference to FIG. 10. FIG. 10 illustrates the relation between the illuminance and the count value in the first counter circuit illustrated in FIG. 3. As illustrated in FIG. 10, the first counter circuit 303 illustrated in FIG. 3 has a so-called upward relation between the illuminance and the count value, in which the count value is increased as the illuminance is higher.

As described above, in the photodetector in this embodiment, a log-compressed voltage can be generated from a current generated depending on the illuminance of incident light, and a digital signal depending on the log-compressed voltage can be generated. Accordingly, the dynamic range with respect to the illuminance can be increased.

Embodiment 2

In this embodiment, a structure and a manufacturing method of the photodetector shown in Embodiment 1 will be described.

Figure 11:
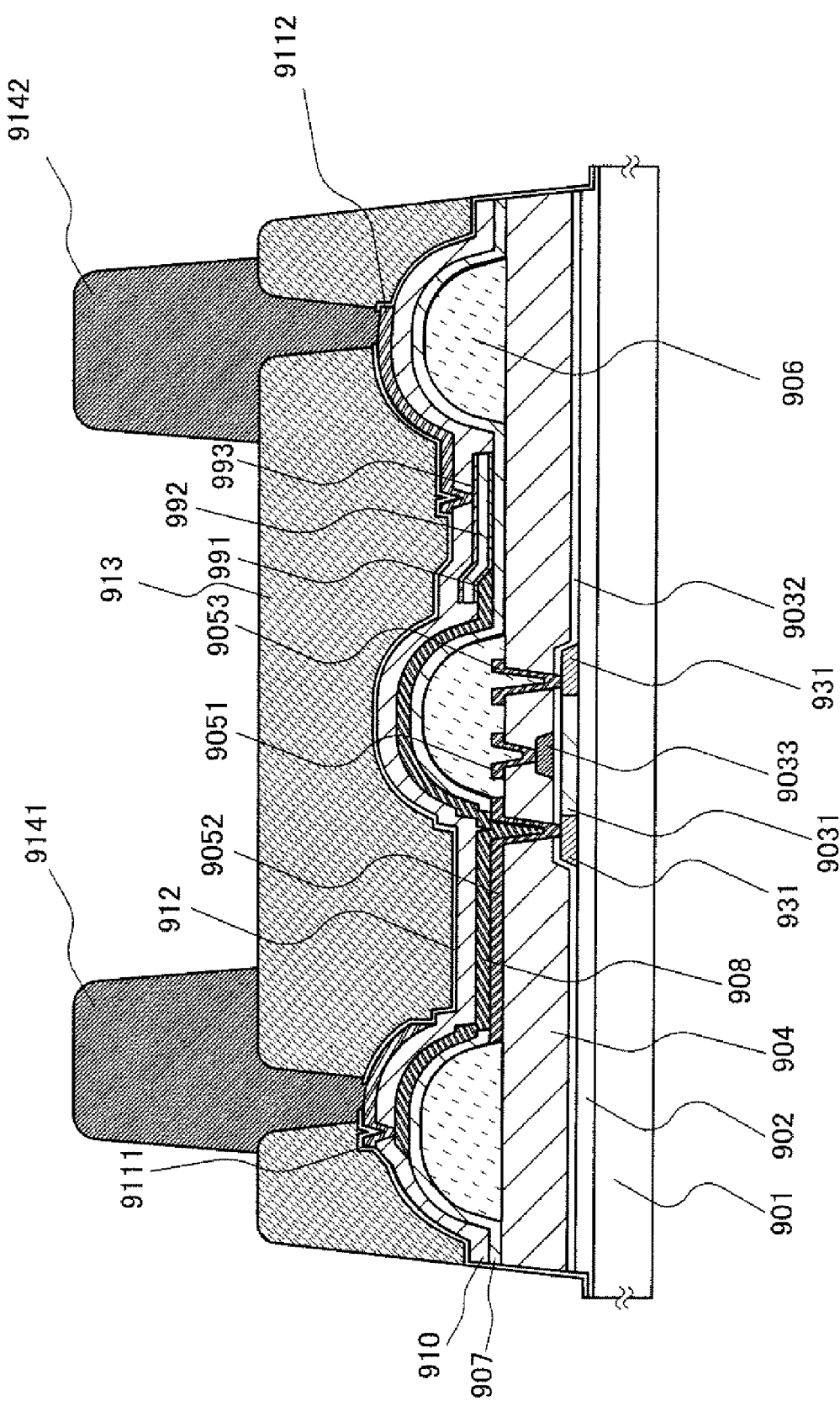
FIG. 11 is a cross-sectional view illustrating an example of a structure of a photodetector in Embodiment 2.

First, a structure of a photodetector in this embodiment will be described with reference to FIG. 11. FIG. 11 is a cross-sectional schematic diagram illustrating a structure of the photodetector in this embodiment. Note that for simplification, all or part of the photodetector illustrated in FIG. 11 is different in size from an actual photodetector.

The photodetector illustrated in FIG. 11 includes a substrate 901; a base film 902; a transistor including a semiconductor layer 9031, a gate insulating film 9032, and a gate electrode 9033; an interlayer film 904; an electrode 9051; an electrode 9052; an electrode 9053; a resin layer 906; an interlayer film 907; an electrode 908; a photoelectric conversion layer including a p-type semiconductor layer 991, a high-resistance semiconductor layer 992, and an n-type semiconductor layer 993; an interlayer film 910; an electrode 9111; an electrode 9112; a passivation film 912; a resin layer 913; an electrode 9141; and an electrode 9142.

As the substrate 901, a glass substrate, a quartz substrate, or a flexible substrate can be used, for example. A flexible substrate refers to a substrate that can be bent (is flexible). An example of the flexible substrate is a plastic substrate formed using polycarbonate, polyarylate, polyethersulfone, or the like. Alternatively, as the substrate 901, an attachment film (formed using polypropylene, polyester, vinyl, polyvinyl fluoride, polyvinyl chloride, or the like), paper of a fibrous material, a base material film (polyester, polyamide, an inorganic film formed by vapor deposition, paper, or the like), or the like can be used.

The base film 902 is provided over the substrate 901. As the base film 902, a silicon oxide film, a silicon nitride film, or a silicon oxide film containing nitrogen can be used, for example. Alternatively, a stack of the above silicon films can be provided as the base film 902. Note that although the base film 902 is not necessarily provided, the provision of the base film 902 can prevent impurities such as alkali metal from diffusing from the substrate 901, for example. When the base film 902 is provided, a silicon substrate, a metal substrate, a stainless steal substrate, or the like can also be used as the substrate 901.

The semiconductor layer 9031 is selectively provided over the base film 902. Note that in the case where the base film 902 is not provided, the semiconductor layer 9031 is selectively provided over the substrate 901. Moreover, a pair of impurity regions 931 are provided in the semiconductor layer 9031. The pair of impurity regions 931 function as part of a source and a drain, and are provided by adding an impurity element having n-type conductivity (also referred to as an n-type impurity element) or an impurity element having p-type conductivity (also referred to as a p-type impurity element) to the semiconductor layer 9031. Further, a plurality of regions having different impurity concentrations may be provided to serve as impurity regions. In that case, a region having a relatively low impurity concentration is referred to as a low-concentration impurity region (also referred to as a lightly doped drain (LDD) region). The provision of the LDD region can suppress the local concentration of electric field.

As the semiconductor layer 9031, a semiconductor layer formed of amorphous silicon, microcrystalline (also referred to as microcrystal) silicon, single crystal silicon, polycrystalline silicon, or the like can be used, for example.

The gate insulating film 9032 is provided over the semiconductor layer 9031. As the gate insulating film 9032, a silicon nitride film, a silicon oxide film, or a silicon oxide film containing nitrogen can be used, for example.

The gate electrode 9033 is provided over part of the gate insulating film 9032, which is over the semiconductor layer 9031. For the gate electrode 9033, an element selected from titanium, tungsten, tantalum, molybdenum, neodymium, cobalt, zirconium, zinc, ruthenium, rhodium, palladium, osmium, iridium, platinum, aluminum, gold, silver, or copper; an alloy material or a compound material containing the above element as its main component; or nitride of the above element can be used, for example. Alternatively, the gate electrode 9033 can be provided by stacking the above materials. For example, the gate electrode 9033 may be formed by stacking a second-layer electrode over part of a first-layer electrode. With this structure, deterioration due to hot carriers can be suppressed. Further, the gate electrode 9033 can be provided to extend over the impurity region 931, and for example, when the LDD region is provided, the gate electrode 9033 can be provided to extend over part of the gate insulating film 9032, which is over the LDD region.

The interlayer film 904 is provided over the gate electrode 9033 and the gate insulating film 9032. As the interlayer film 904, a silicon oxide film, a silicon nitride film, or a silicon oxide film containing nitrogen can be used, for example. Alternatively, the above silicon films can be stacked to serve as the interlayer film 904.

The electrode 9051 is in contact with the gate electrode 9033 through an opening portion provided in the interlayer film 904. The electrode 9052 is provided so as to be in contact with one of the pair of impurity regions 931 in the semiconductor layer 9031 through an opening portion provided in the gate insulating film 9032 and the interlayer film 904. The electrode 9053 is provided so as to be in contact with the other of the pair of impurity regions 931 in the semiconductor layer 9031 through an opening portion provided in the gate insulating film 9032 and the interlayer film 904. For the electrodes 9051 to 9053, an element selected from titanium, tungsten, tantalum, molybdenum, neodymium, cobalt, zirconium, zinc, ruthenium, rhodium, palladium, osmium, iridium, platinum, aluminum, gold, silver, or copper; an alloy material or a compound material containing the above element as its main component; or nitride of the above element can be used, for example. Alternatively, the electrodes 9051 to 9053 can be provided by stacking the above materials.

The resin layer 906 functions as a planarization film and is provided over the interlayer film 904, the electrode 9051, the electrode 9052, and the electrode 9053 as selected. In the photodetector illustrated in FIG. 11, the resin layers 906 are provided over the transistor and also at portions over which the electrode 9141 and the electrode 9142 are to be provided. At this time, the edge of the resin layer 906 is preferably curved in the cross section. With the curved shape of the resin layer 906, the coverage of a film provided over the resin layer 906 can be improved. For the resin layer 906, a heat-resistant high-molecular material such as polyimide, aromatic polyamide, or polybenzimidazole, or a siloxane resin can be use. Moreover, for the resin layer 906, a resin material such as a vinyl resin such as polyvinyl alcohol or polyvinyl butyral; an epoxy resin; a phenol resin; a novolac resin; an acrylic resin; a melamine resin; or a urethane resin can be used, for example.

The interlayer film 907 is provided over the resin layer 906 and part of the interlayer film 904, the electrode 9051, the electrode 9052, and the electrode 9053, over which the resin layer 906 is not provided. As the interlayer film 907, a silicon oxide film, a silicon nitride film, or a silicon oxide film containing nitrogen can be used, for example. Alternatively, the above silicon films can be stacked to serve as the interlayer film 907. Further alternatively, the above silicon film may be provided and a silicon oxide film formed using tetraethyl orthosilicate (TEOS) may be stacked over the silicon film to serve as the interlayer film 907.

The electrode 908 is in contact with the electrode 9052 through an opening portion provided in the interlayer film 907. For the electrode 908, an element selected from titanium, tungsten, tantalum, molybdenum, neodymium, cobalt, zirconium, zinc, ruthenium, rhodium, palladium, osmium, iridium, platinum, aluminum, gold, silver, or copper; an alloy material or a compound material containing the above element as its main component; or nitride of the above element can be used, for example. Alternatively, the electrode 908 can be provided by stacking the above materials.

The p-type semiconductor layer 991 is provided so as to be in contact with the edge of the electrode 908. The high-resistance semiconductor layer 992 is provided over the p-type semiconductor layer 991. The n-type semiconductor layer 993 is provided over the high-resistance semiconductor layer 992. The high-resistance semiconductor layer 992 is a semiconductor layer whose resistance is higher than that of the p-type semiconductor layer 991 and the n-type semiconductor layer 993. At this time, the edge of the electrode 908 which is in contact with the p-type semiconductor layer 991 is preferably tapered. With the tapered shape of the electrode 908, the coverage of the p-type semiconductor layer 991 can be improved.

The interlayer film 910 is provided over the interlayer film 907, the electrode 908, and the photoelectric conversion layer. As the interlayer film 910, a silicon oxide film, a silicon nitride film, or a silicon oxide film containing nitrogen can be used, for example. Alternatively, the above silicon films can be stacked to serve as the interlayer film 910. Further alternatively, the above silicon film may be provided and a silicon oxide film formed using tetraethyl orthosilicate (TEOS) may be stacked over the silicon film to serve as the interlayer film 910.

The electrode 9111 is in contact with the electrode 908 through an opening portion provided in the interlayer film 910. The electrode 9112 is in contact with the photoelectric conversion layer through an opening portion provided in the interlayer film 910. For the electrodes 9111 and 9112, an element selected from titanium, tungsten, tantalum, molybdenum, neodymium, cobalt, zirconium, zinc, ruthenium, rhodium, palladium, osmium, iridium, platinum, aluminum, gold, silver, or copper; an alloy material or a compound material containing the above element as its main component; or nitride of the above element can be used, for example. Alternatively, the electrodes 9111 and 9112 can be provided by stacking the above materials.

The passivation film 912 is provided over the interlayer film 910 and the electrodes 9111 and 9112, and is in contact with one or both of the edges of the base film 902, the gate insulating film 9032, and the interlayer films 904, 907, and 910. As the passivation film 912, a silicon oxide film, a silicon nitride film, or a silicon oxide film containing nitrogen can be used, for example.

The resin layer 913 is provided over the passivation film 912.

The electrode 9141 is provided so as to be in contact with the electrode 9111 through an opening portion provided in the passivation film 912 and the resin layer 913. The electrode 9142 is in contact with the electrode 9112 through an opening portion provided in the passivation film 912 and the resin layer 913. For the electrodes 9141 and 9142, an element selected from titanium, tungsten, tantalum, molybdenum, neodymium, cobalt, zirconium, zinc, ruthenium, rhodium, palladium, osmium, iridium, platinum, aluminum, gold, silver, or copper; an alloy material or a compound material containing the above element as its main component; or nitride of the above element can be used, for example. Alternatively, the electrodes 9141 and 9142 can be provided by stacking the above materials. Further, a conductive resin film may be provided so as to be in contact with the electrode 9111 or the electrode 9112 and the above material may be stacked over the conductive resin film to serve as the electrode 9141 or the electrode 9142.

With the above structure, the photodetector in Embodiment 1 can be formed. Since a transistor and a photoelectric conversion layer can be formed over one substrate in the photodetector in this embodiment, the photodetector can be easily manufactured and thus can be easily mass-produced.

Next, a method of manufacturing the photodetector in this embodiment will be described with reference to FIGS. 12A to 12C, FIGS. 13A to 13C, FIGS. 14A to 14C, FIGS. 15A to 15C, and FIG. 16. FIGS. 12A to 12C, FIGS. 13A to 13C, FIGS. 14A to 14C, FIGS. 15A to 15C, and FIG. 16 are cross-sectional schematic diagrams illustrating a method of manufacturing the photodetector in this embodiment.

Figure 12A:
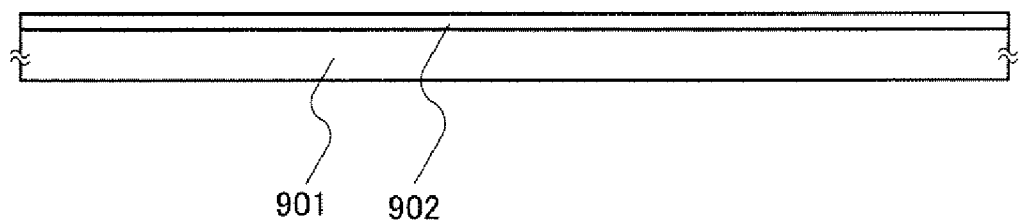
FIGS. 12A to 12C are cross-sectional views illustrating an example of a method of manufacturing a photodetector in Embodiment 2.

First, as illustrated in FIG. 12A, the base film 902 is formed over the substrate 901. The base film 902 can be formed by a plasma CVD method or the like, for example. Here, as an example a glass substrate (AN100) with a thickness of 0.7 mm is used as the substrate 901. Then, in order to form the base film 902, a silicon nitride oxide film is formed to a thickness of 140 nm and a silicon oxynitride film is formed to a thickness of 100 nm over the silicon nitride oxide film.

Figure 12B:
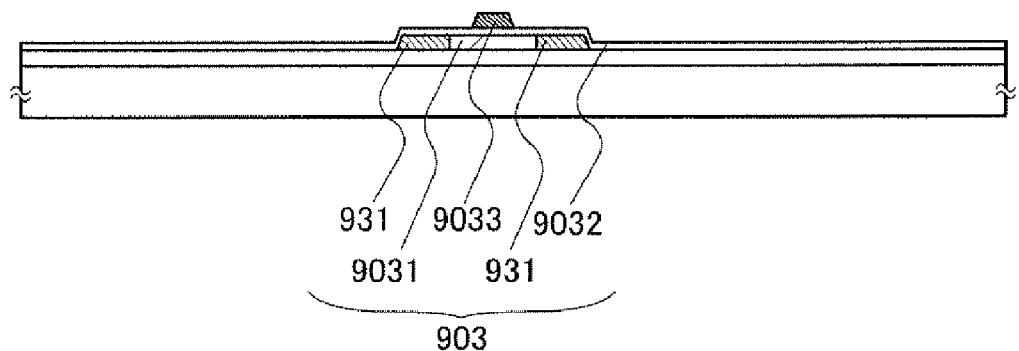

Next, as illustrated in FIG. 12B, a transistor 903 is formed over the base film 902. A specific method of manufacturing the transistor 903 will be described below.

The transistor 903 is formed in such a manner that the semiconductor layer 9031 is selectively formed over the base film 902, the gate insulating film 9032 is formed over the semiconductor layer 9031, and the gate electrode 9033 is formed over part of the gate insulating film 9032, which is over the semiconductor layer 9031. When a polycrystalline semiconductor film is used as the semiconductor layer 9031, the polycrystalline semiconductor film can be formed by crystallizing an amorphous semiconductor film by a known technique (such as a solid-phase epitaxy method, a laser crystallization method, or a crystallization method using catalytic metal), for example.

In addition, when a single crystal semiconductor layer is used as the semiconductor layer 9031, a silicon-on-insulator (SOI) substrate can be used, for example. As the SOI substrate, a known SOI substrate can be used, and a manufacturing method and a structure thereof are not limited to particular types. Typical examples of the SOI substrate are a SIMOX substrate and a bonded substrate. Moreover, examples of the bonded substrate are ELTRAN (registered trademark), UNIBOND (registered trademark), and Smart Cut (registered trademark).

An SOI structure of the SIMOX substrate can be obtained in such a manner that an oxygen ion is introduced into a single crystal silicon substrate, and heat treatment at 1300° C. or more is performed to form a buried oxide (BOX) layer, so that a thin silicon layer is formed on the surface of the single crystal silicon substrate. The thin silicon layer is insulated from the single crystal silicon substrate with the buried oxide layer. Further, a technique called internal thermal oxidation (ITOX) in which further thermal oxidation is performed can be used after the buried oxide layer is formed.

A bonded substrate is an SOI substrate which is obtained in such a manner that two single crystal silicon substrates (a first single crystal silicon substrate and a second single crystal silicon substrate) are bonded with an oxide layer therebetween and one of the single crystal silicon substrates is thinned from a surface on the side which is opposite to the bonded side, so that a thin silicon layer is formed on the surface. The oxide layer can be formed by thermal oxidation of one of the substrates (here, the first single crystal silicon substrate). Further, the two single crystal silicon substrates can be bonded directly without using an adhesive.

Note that as the bonded substrate, an SOI substrate may be formed by bonding a substrate having an insulating surface, such as a glass substrate, and a single crystal substrate to each other, without being limited to bonding two single crystal substrates.

Here, as an example, a polycrystalline semiconductor layer with a thickness of 50 nm is formed as the semiconductor layer 9031. A specific manufacturing method will be described below.

First, an amorphous silicon film containing hydrogen is formed over the base film 902 without being exposed to the atmosphere, and a nickel acetate solution containing nickel of 10 ppm by weight is added by a spinner. Note that a nickel element may be dispersed over the entire surface by a sputtering method instead of a method of adding the solution. Next, after the heat treatment (at 500° C. for 1 hour), heat treatment for crystallization (at 550° C. for 4 hours) is performed to form a polycrystalline silicon film.

Then, an oxide film on a surface of the polycrystalline silicon film is removed with dilute hydrofluoric acid or the like. After that, irradiation with laser light (XeCl: a wavelength of 308 nm) for increasing the crystallization rate and repairing defects left in crystal grains is performed in the atmosphere or an oxygen atmosphere.

Excimer laser light of a wavelength of 400 nm or less, or the second harmonic or the third harmonic of a YAG laser is used for the laser light. Here, pulsed laser light with a frequency of approximately 10 Hz to 1000 Hz is used, the pulsed laser light is condensed to 100 mJ/cm$^2$ to 500 mJ/cm$^2$ by an optical system, and irradiation is performed with an overlap rate of 90% to 95% to scan the surface of the silicon film. In this embodiment, irradiation with laser light with a frequency of 30 Hz and an energy density of 470 mJ/cm$^2$ is performed in the atmosphere.

Note that since the laser light irradiation is performed in the atmosphere or an oxygen atmosphere, an oxide film is formed on the surface of the silicon film by the laser light irradiation. Note that although an example in which the pulsed laser is used is shown in this embodiment, a continuous wave laser may be used. In order to obtain crystals with large grain size at the time of crystallization of a semiconductor film, it is preferable to use a solid laser which is capable of continuous oscillation and to apply the second to fourth harmonic of a fundamental wave. Typically, the second harmonic (532 nm) or the third harmonic (355 nm) of a Nd:YVO$_4$ laser (fundamental wave: 1064 nm) may be employed.

When a continuous wave laser is used, laser light emitted from a continuous wave YVO$_4$ laser of 10 W output is converted into a harmonic by a non-linear optical element. The harmonic may also be emitted by setting a $YVO_4$ crystal and a non-linear optical element in a resonator. Then, the laser light having a rectangular shape or an elliptical shape on an irradiation surface is preferably formed by an optical system, and an object is irradiated with this laser light. At this time, the energy density of approximately 0.01 $MW/cm^2$ to 100 $MW/cm^2$ (preferably 0.1 $MW/cm^2$ to 10 $MW/cm^2$) is necessary. Moreover, the semiconductor film is moved at a speed of approximately 10 cm/s to 2000 cm/s relatively to the laser light so as to be irradiated with the laser light.

Next, in addition to the oxide film formed by the above laser light irradiation, a barrier layer formed of an oxide film having a thickness of 1 nm to 5 nm in total is formed by surface treatment with ozone water for 120 seconds. This barrier layer is formed in order to remove a catalytic element added for crystallization, for example, nickel (Ni) from the film. Although the barrier layer is formed using ozone water here, a barrier layer may be formed by a method of oxidizing a surface of a semiconductor film having a crystal structure by UV irradiation in an oxygen atmosphere; a method of oxidizing a surface of a semiconductor film having a crystal structure by an oxygen plasma treatment or the like; or depositing an oxide film having a thickness of approximately 1 nm to 10 nm by a plasma CVD method, a sputtering method, an evaporation method, or the like. Further, before the barrier layer is formed, the oxide film formed by the laser light irradiation may be removed.

Next, an amorphous silicon film containing an argon element which serves as a gettering site is formed to a thickness of 10 nm to 400 nm, here a thickness of 100 nm, over the barrier layer by a sputtering method. Here, the amorphous silicon film containing the argon element is formed using a silicon target in an atmosphere containing argon. When the amorphous silicon film containing the argon element is formed by a plasma CVD method, deposition conditions are as follows: a flow ratio of monosilane to argon ($SiH_4$:Ar) is 1:99, the deposition pressure is set to 6.665 Pa, the RF power density is set to 0.087 $W/cm^2$, and the deposition temperature is set to 350° C.

After that, heat treatment in a furnace heated to 650° C. is performed for 3 minutes to remove a catalyst element (to perform gettering). Accordingly, the catalyst element concentration in the semiconductor film having a crystal structure is reduced. A lamp annealing apparatus may be used instead of the furnace.

Next, the amorphous silicon film containing the argon element, which is a gettering site, is selectively removed using the barrier layer as an etching stopper, and after that, the barrier layer is selectively removed with dilute hydrofluoric acid. Since nickel tends to move to a region with a high concentration of oxygen in gettering, the barrier layer formed of an oxide film is preferably removed after the gettering.

Note that in the case where crystallization of a semiconductor film using a catalytic element is not performed, the above steps such as the formation of the barrier layer, the formation of the gettering site, the heat treatment for gettering, the removal of the gettering site, and the removal of the barrier layer are not necessary.

Moreover, in this embodiment, a thin oxide film is formed on the surface of the obtained semiconductor film having a crystalline structure (e.g., a crystalline silicon film) with ozone water, and then, a resist mask is formed using a first photomask and the semiconductor film is etched to have a desired shape, so that the island-shaped semiconductor layer 9031 is formed. After that, the resist mask is removed.

Further, in this embodiment, an impurity element (boron or phosphorus) is added to the semiconductor layer 9031, so that the pair of impurity regions 931 are formed. The impurity element can be added by an ion doping method, for example.

Note that the surface of the semiconductor layer 9031 is preferably cleaned at the same time as the oxide film is removed with an etchant containing hydrofluoric acid.

Next, the gate insulating film 9032 is formed over the semiconductor layer 9031. The gate insulating film 9032 can be formed by a plasma CVD method, for example. Here, a 30-nm-thick silicon oxynitride film is formed as the gate insulating film 9032.

Then, the gate electrode 9033 is formed over part of the gate insulating film 9032, which is over the semiconductor layer 9031. Here, as an example, the gate electrode 9033 is formed in such a manner that a 30-nm-thick tantalum nitride film is formed over the part of the gate insulating film 9032, which is over the semiconductor layer 9031, and a 170-nm-thick tungsten film is formed over the tantalum nitride film, and then these films are etched.

Figure 12C:
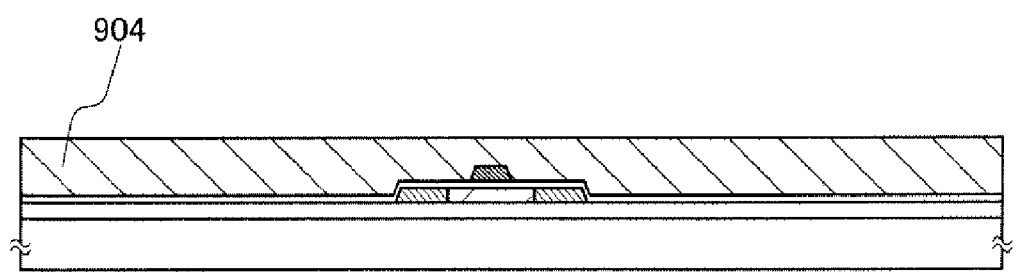

Next, as illustrated in FIG. 12C, the interlayer film 904 is formed over the transistor 903. Here, as an example, the interlayer film 904 is formed in such a manner that a 50-nm-thick silicon oxynitride film is formed over the transistor 903, a 165-nm-thick silicon nitride oxide film is formed over the silicon oxynitride film, and a 600-nm-thick silicon oxynitride film is formed over the silicon nitride oxide film.

Figure 13A:
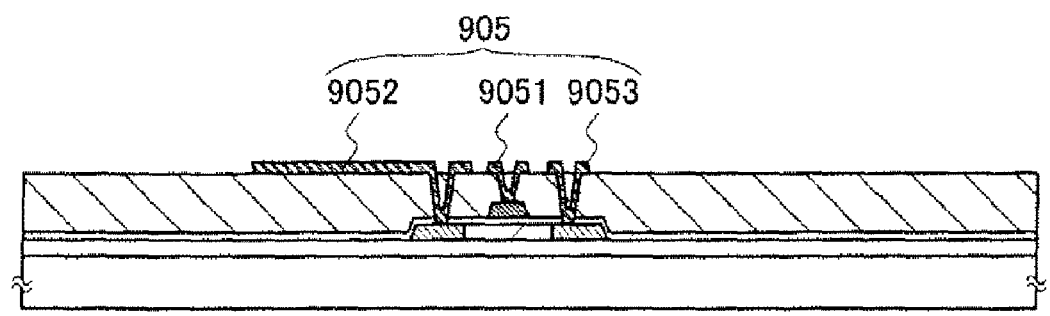
FIGS. 13A to 13C are cross-sectional views illustrating an example of a method of manufacturing a photodetector in Embodiment 2.

Then, as illustrated in FIG. 13A, an electrode 905 is formed over the interlayer film 904. Specifically, opening portions are selectively formed in the interlayer film 904, and further, the electrode 9051 is formed so as to be in contact with the gate electrode 9033 through the opening portion. Moreover, the electrode 9052 is formed so as to be in contact with one of the pair of impurity regions 931 through the opening portion, and the electrode 9053 is formed so as to be in contact with the other of the pair of impurity regions 931 through the opening portion. Here, as an example, the electrodes 9051 to 9053 are formed in such a manner that a 100-nm-thick first titanium film is formed, a 100-nm-thick aluminum film is formed over the first titanium film, and a 50-nm-thick second titanium film is formed over the aluminum film, and then these films are etched.

Figure 13B:
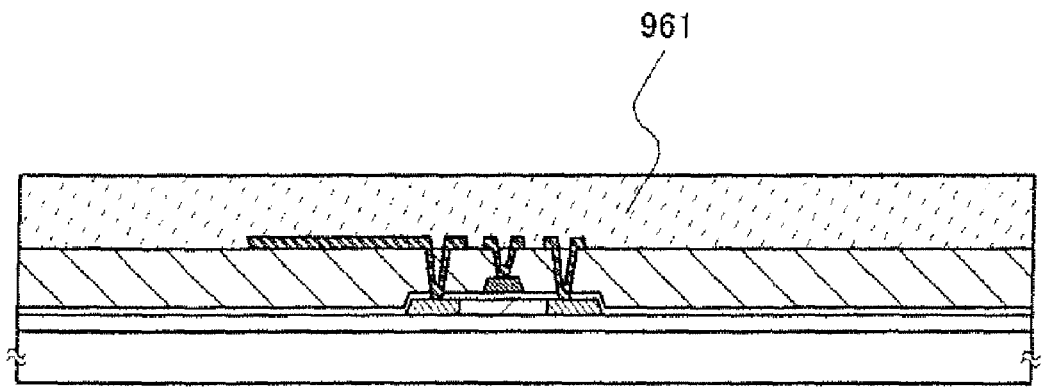

Next, as illustrated in FIG. 13B, a resin film 961 is formed over the interlayer film 904 and the electrode 905. Here, a 1.5-μm-thick polyimide film is formed as the resin film 961.

Figure 13C:
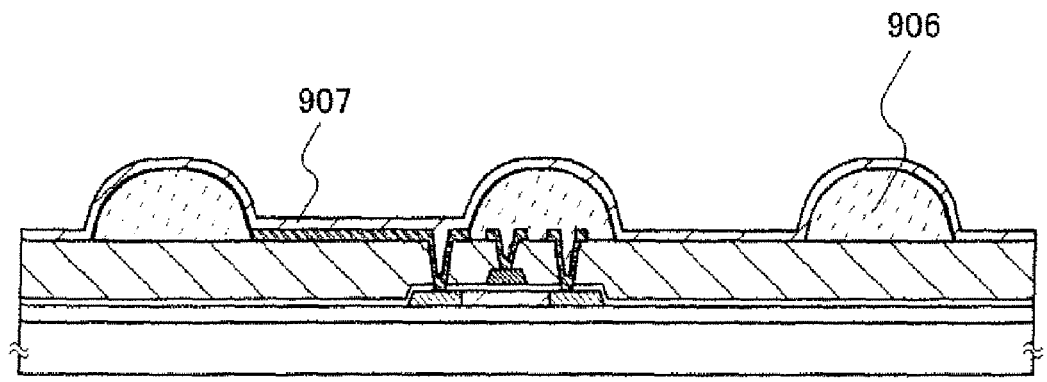

Then, as illustrated in FIG. 13C, the resin film 961 is processed to selectively form the resin layer 906 whose edge is curved in the cross section. Moreover, the interlayer film 907 is formed over the resin layer 906 and part of the interlayer film 904 and the electrode 905, where the resin layer 906 is not provided. Here, as an example, the interlayer film 907 is formed in such a manner that a 100-nm-thick silicon nitride film is formed, and a 200-nm-thick silicon oxide film is formed using TEOS over the silicon nitride film.

Figure 14A:
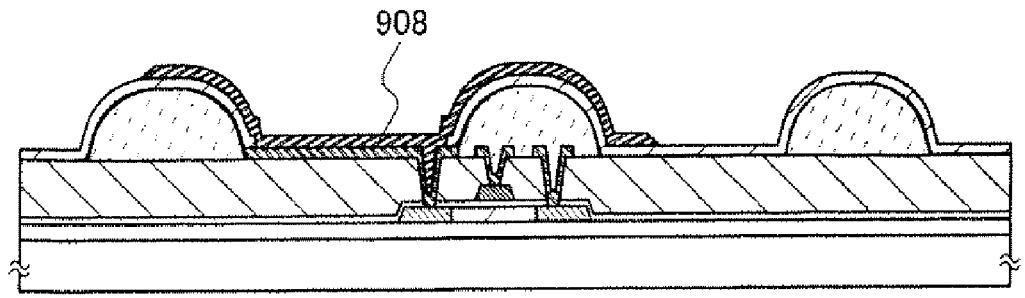
FIGS. 14A to 14C are cross-sectional views illustrating an example of a method of manufacturing a photodetector in Embodiment 2.

Next, as illustrated in FIG. 14A, an opening portion is formed in the interlayer film 907, and the electrode 908 is formed so as to be in contact with the electrode 9052 through the opening portion. Here, a 400-nm-thick titanium film is formed and etched, so that the electrode 908 is formed. Note that at this time, the edge of the electrode 908 is preferably processed to have a tapered shape. The electrode 908 having the tapered edge can be formed by a photolithography step using a gray-tone mask, for example.

Figure 14B:
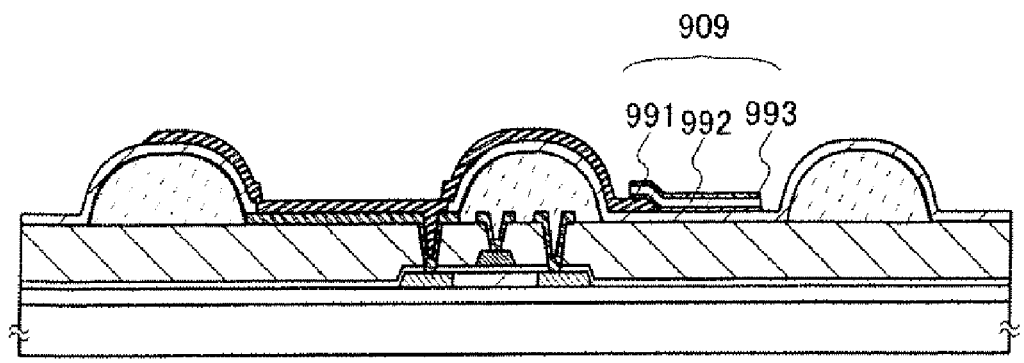

Then, as illustrated in FIG. 14B, a photoelectric conversion layer 909 is formed so as to be in contact with the edge of the electrode 908. Here, as an example, the photoelectric conversion layer 909 is formed in such a manner that the p-type semiconductor layer 991 is formed to a thickness of 60 nm so as to be in contact with the edge of the electrode 908, the high-resistance semiconductor layer 992 is formed to a thickness of 400 nm over the p-type semiconductor layer 991, and the n-type semiconductor layer 993 is formed to a thickness of 80 nm over the high-resistance semiconductor layer 992.

Figure 14C:
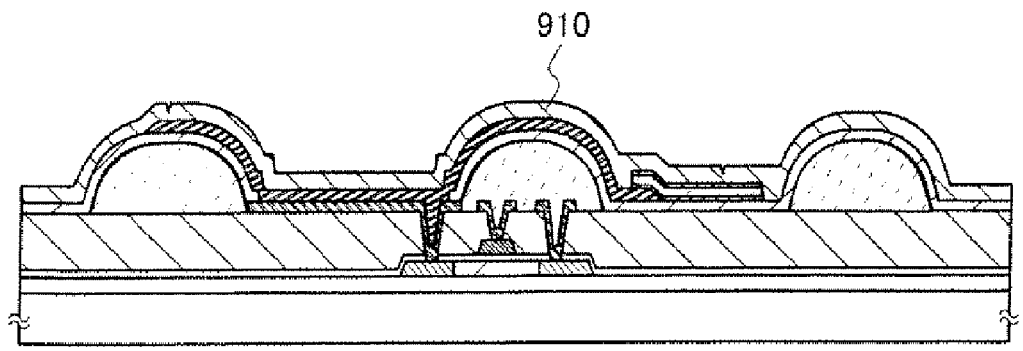

Next, as illustrated in FIG. 14C, the interlayer film 910 is formed over the interlayer film 907, the electrode 908, and the photoelectric conversion layer 909. Here, as an example, the interlayer film 910 is formed in such a manner that a 100-nm-thick silicon nitride film is formed and a 400-nm-thick silicon oxide film is formed using TEOS over the silicon nitride film.

Figure 15A:
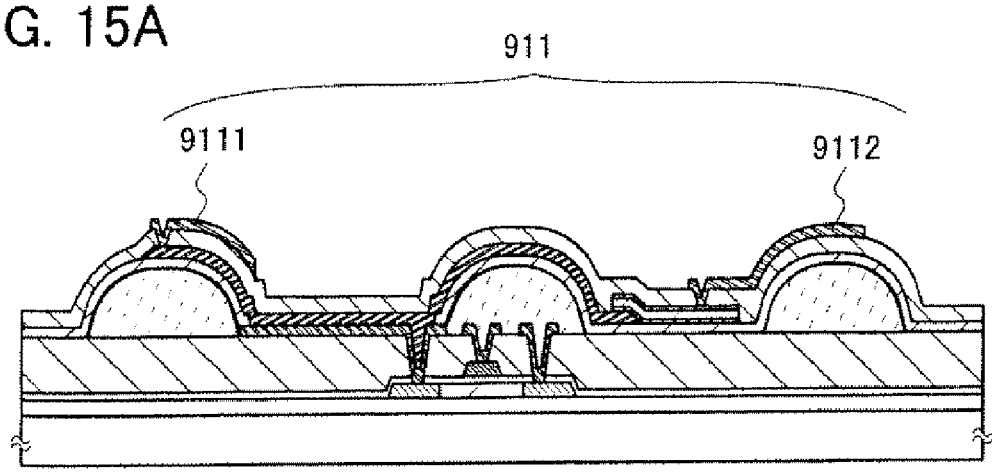
FIGS. 15A to 15C are cross-sectional views illustrating an example of a method of manufacturing a photodetector in Embodiment 2.

Then, as illustrated in FIG. 15A, opening portions are formed in the interlayer film 910, and further, the electrode 9111 is formed so as to be in contact with the electrode 908 through the opening portion, and the electrode 9112 is formed so as to be in contact with the n-type semiconductor layer 993 in the photoelectric conversion layer 909 through the opening portion. Here, as an example, the electrodes 9111 and 9112 are formed in such a manner that a 50-nm-thick first titanium film is formed, a 100-nm-thick aluminum film is formed over the first titanium film, and a 50-nm-thick second titanium film is formed over the aluminum film, and then these films are etched.

Figure 15B:
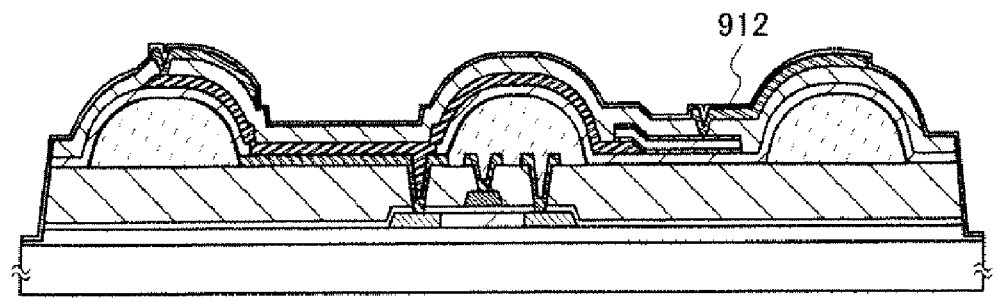

Next, as illustrated in FIG. 15B, an opening portion is formed in the gate insulating film 9032 and the interlayer films 904, 907, and 910. Moreover, the passivation film 912 is formed so as to be in contact with the base film through the opening portion and to cover the gate insulating film 9032, the interlayer films 904, 907, and 910, and the electrodes 9111 and 9112. Here, as an example, the passivation film 912 is formed of a 100-nm-thick silicon nitride film.

Figure 15C:
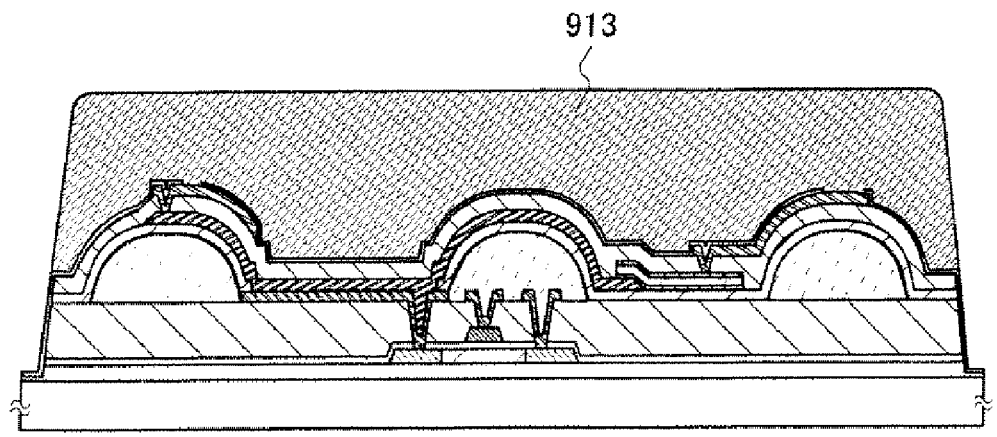

Then, as illustrated in FIG. 15C, the resin layer 913 is formed over the interlayer film 910 and part of the passivation film 912, which is over the electrodes 9111 and 9112. Here, as an example, the resin layer 913 is formed of a 25-μm-thick insulating resin.

Figure 16:
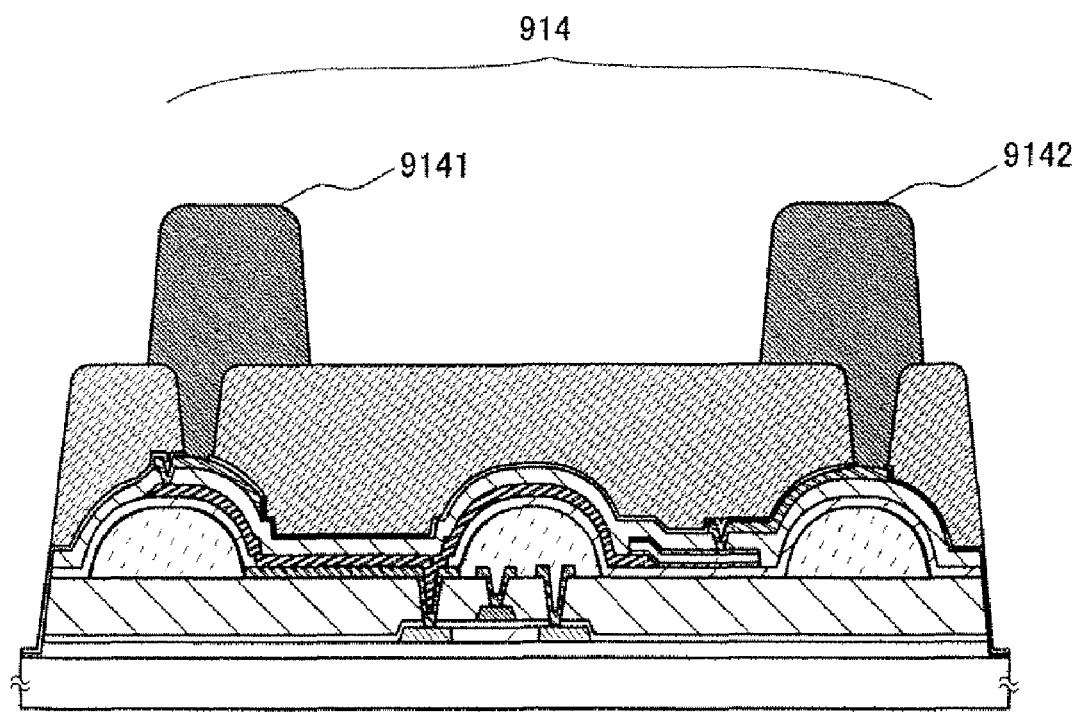
FIG. 16 is a cross-sectional view illustrating an example of a method of manufacturing a photodetector in Embodiment 2.

Next, as illustrated in FIG. 16, opening portions are formed in the resin layer 913, and electrodes 914 are formed through the opening portions. Specifically, the electrode 9141 is formed so as to be in contact with the electrode 9111 though one of the opening portions, and the electrode 9142 is formed so as to be in contact with the electrode 9112 through the other of the opening portions. Here, as an example, the electrode 914 is formed in such a manner that a 1.5-μm-thick nickel resin film is formed, a 150-nm-thick titanium film is formed over the nickel resin film, a 750-nm-thick nickel film is formed over the titanium film, and a 50-nm-thick gold film is formed over the nickel film, and then these films are etched.

Through the above steps, the photodetector in this embodiment can be manufactured. Note that the structure is not limited to the above structure, and the photodetector can have another structure.

Note that this embodiment can be combined with any of other embodiments as appropriate.

Embodiment 3

In this embodiment, electronic devices to which the photodetector which is one embodiment of the present invention is applied will be described.

The photodetector which is one embodiment of the present invention can be applied to a photo-detection portion of a variety of electronic devices such as a computer, a display, a mobile phone, and a television receiver. Examples of specific structures of such electronic devices will be described with reference to FIG. 17, FIGS. 18A and 18B, FIGS. 19A and 19B, FIG. 20, and FIGS. 21A and 21B. FIG. 17, FIGS. 18A and 18B, FIGS. 19A and 19B, FIG. 20, and FIGS. 21A and 21B are schematic diagrams each illustrating a structure of an electronic device in this embodiment, which is provided with the photodetector of the present invention.

Figure 17:
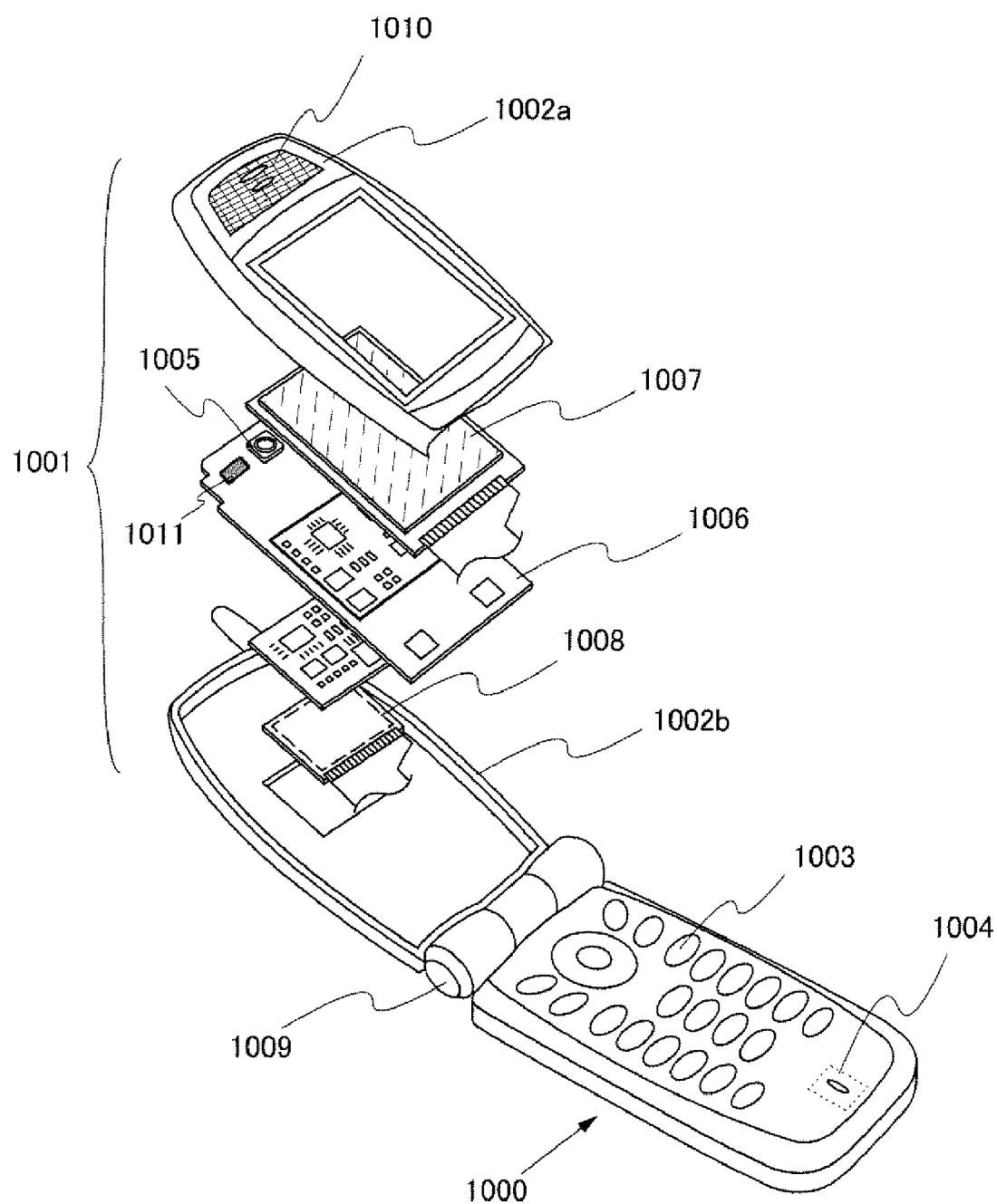
FIG. 17 is a schematic diagram illustrating a structure of an electronic device in Embodiment 3, to which a photodetector of the present invention is applied.

FIG. 17 illustrates a mobile phone which includes a main body (A) 1000, a main body (B) 1001, a housing 1002a, a housing 1002b, operation keys 1003, an audio input portion 1004, an audio output portion 1005, a circuit board 1006, a display panel (A) 1007, a display panel (B) 1008, a hinge 1009, a light-transmitting material portion 1010, and a photodetector 1011. The photodetector which is one embodiment of the present invention can be applied to the photodetector 1011.

In the mobile phone illustrated in FIG. 17, light transmitted through the light-transmitting material portion 1010 is detected by the photodetector 1011, and the luminance of the display panel (A) 1007 and the display panel (B) 1008 is controlled in accordance with the illuminance of detected external light, and the illumination of the operation keys 1003 is controlled in accordance with the illuminance of light obtained in the photodetector 1011. Accordingly, current consumption of the mobile phone can be suppressed.

Figure 18A:
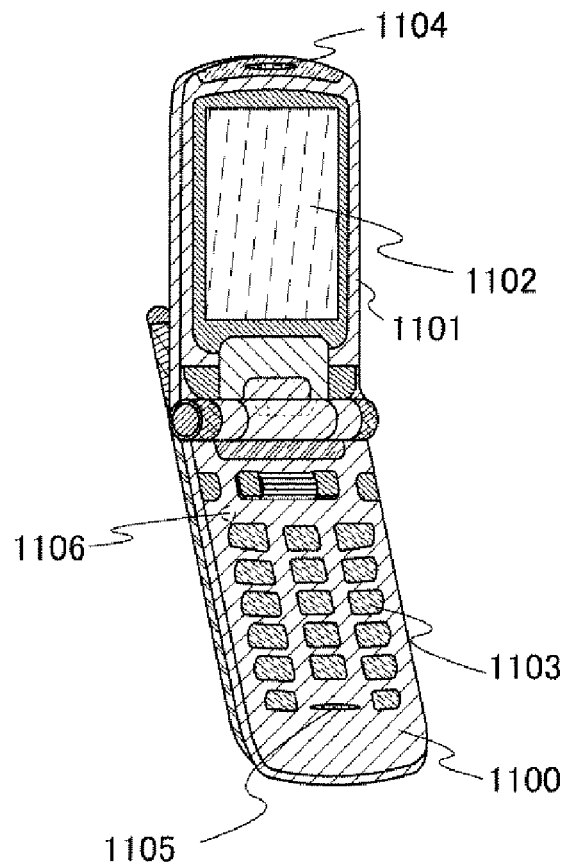
FIGS. 18A and 18B are schematic diagrams each illustrating a structure of an electronic device in Embodiment 3, to which a photodetector of the present invention is applied.
Figure 18B:
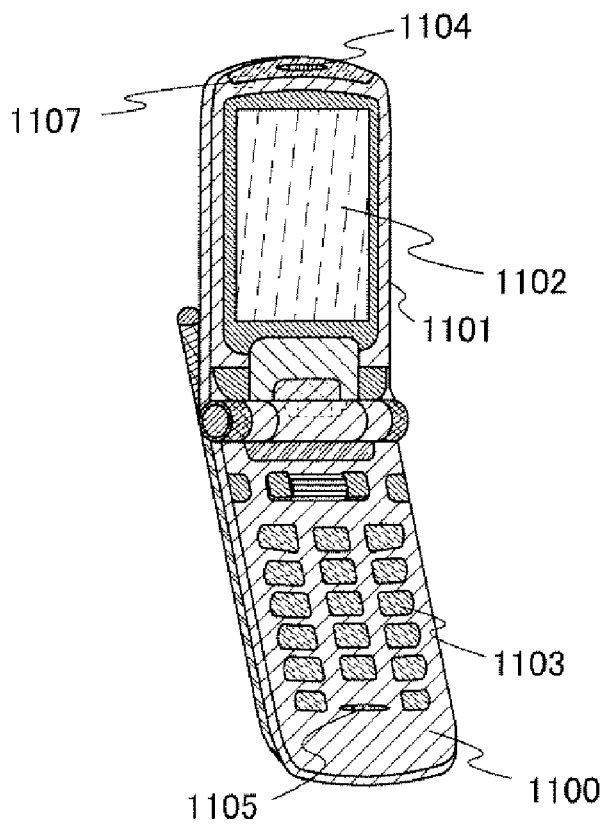

FIGS. 18A and 18B illustrate other examples of mobile phones. FIGS. 18A and 18B illustrate a main body 1100, a housing 1101, a display panel 1102, operation keys 1103, an audio output portion 1104, an audio input portion 1105, and a photodetector 1106 or a photodetector 1107.

In the mobile phone illustrated in FIG. 18A, the luminance of the display panel 1102 and the operation keys 1103 can be controlled by detecting external light by the photodetector 1106 provided at the main body 1100.

In the mobile phone illustrated in FIG. 18B, the photodetector 1107 is provided inside the main body 1100, which is different from the structure of FIG. 18A. By the photodetector 1107, the luminance of a backlight provided at the display panel 1102 can be detected.

Figure 19A:
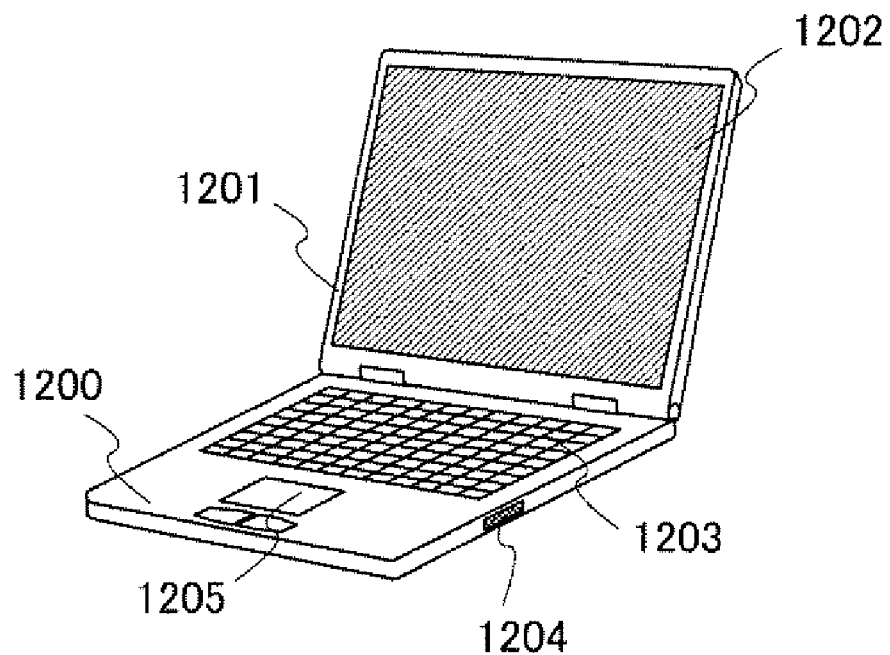
FIGS. 19A and 19B are schematic diagrams each illustrating a structure of an electronic device in Embodiment 3, to which a photodetector of the present invention is applied.

FIG. 19A illustrates a computer which includes a main body 1200, a housing 1201, a display portion 1202, a keyboard 1203, an external connection port 1204, a pointing device 1205, and the like.

Figure 19B:
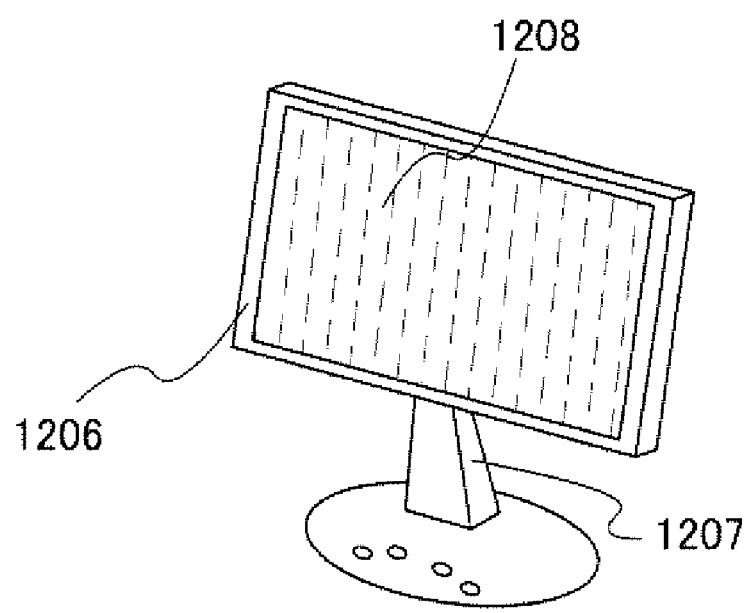

FIG. 19B illustrates a display device such as a television receiver. The display device in FIG. 19B includes a housing 1206, a support base 1207, a display portion 1208, and the like.

Figure 20:
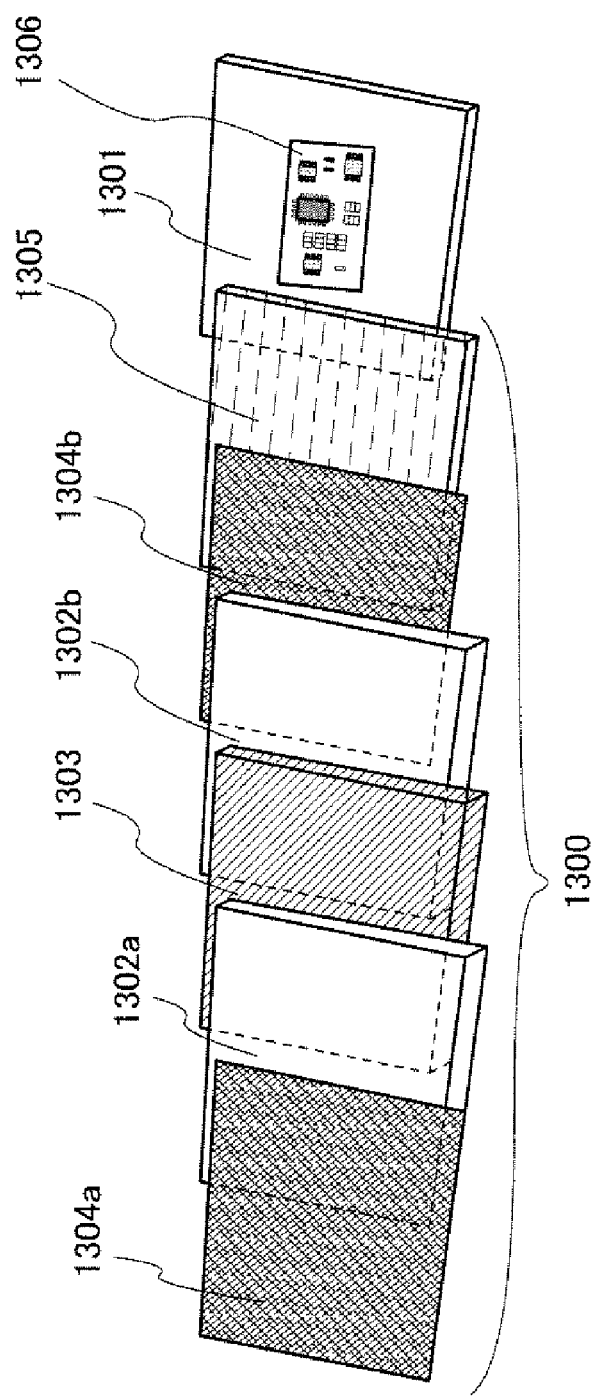
FIG. 20 is a schematic diagram illustrating a structure of an electronic device in Embodiment 3, to which a photodetector of the present invention is applied.

FIG. 20 illustrates a detailed structure of a display portion in the case where a liquid crystal panel is used for the display portion 1202 of the computer in FIG. 19A and the display portion 1208 of the display device in FIG. 19B.

A liquid crystal panel 1300 illustrated in FIG. 20 is incorporated into a housing 1301 and includes substrates 1302a and 1302b, a liquid crystal layer 1303 provided between the substrates 1302a and 1302b, polarizing filters 1304a and 1304b, a backlight 1305, and the like. Moreover, a photodetector 1306 is formed in the housing 1301.

The photodetector 1306 to which the photodetector which is one embodiment of the present invention is applied detects the amount of light from the backlight 1305, and the information is fed back for adjusting the luminance of the liquid crystal panel 1300.

Figure 21A:
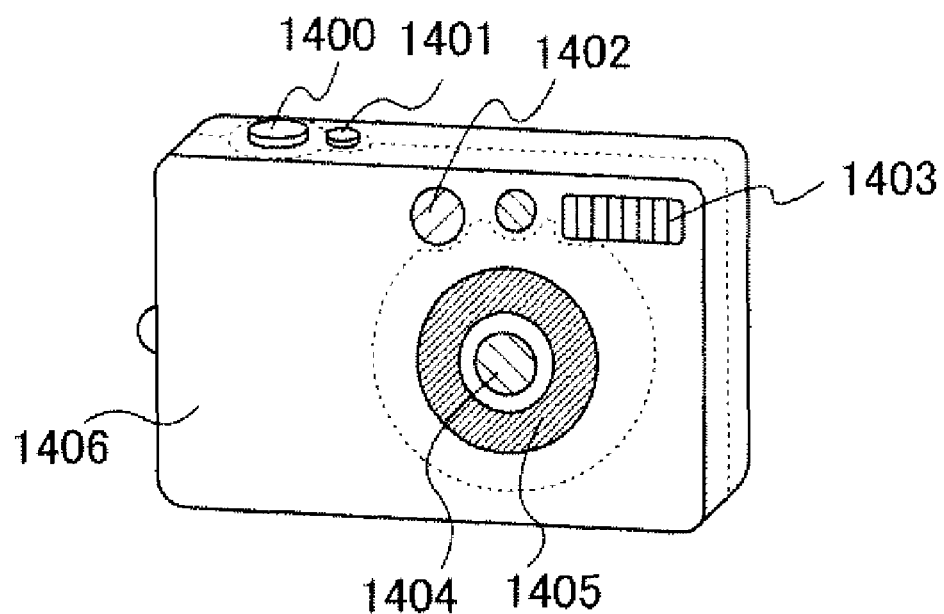
FIGS. 21A and 21B are schematic diagrams illustrating a structure of an electronic device in Embodiment 3, to which a photodetector of the present invention is applied.
Figure 21B:
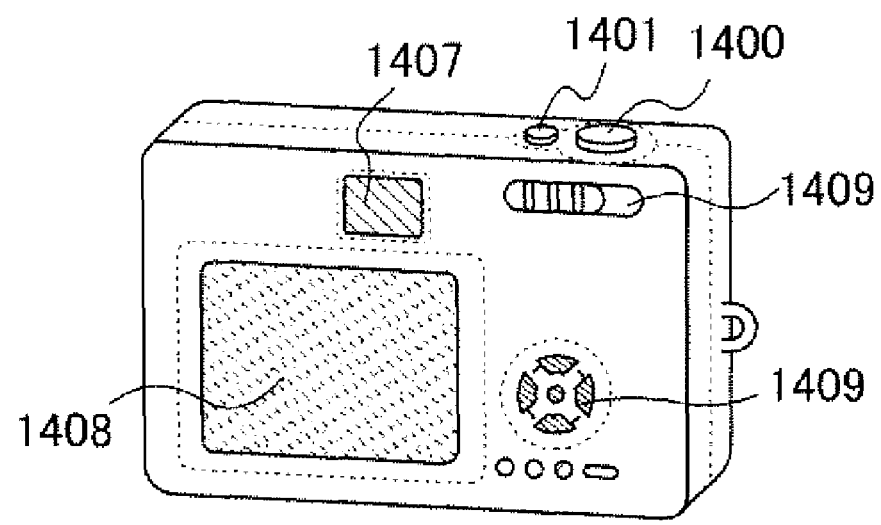

FIGS. 21A and 21B illustrate an example in which the photodetector which is one embodiment of the present invention is applied to a camera, for example, a digital camera. FIG. 21A is a perspective view of the digital camera seen from the front side, and FIG. 21B is a perspective view of the digital camera seen from the back side. In FIG. 21A, the digital camera is provided with a release button 1400, a main switch 1401, a viewfinder 1402, a flash portion 1403, a lens 1404, a lens barrel 1405, and a housing 1406.

Further, in FIG. 21B, a viewfinder eyepiece 1407, a monitor 1408, and operation buttons 1409 are provided.

When the release button 1400 is pushed down to the half point, a focus adjustment mechanism and an exposure adjustment mechanism are operated. When the release button 1400 is pushed down to the lowest point, a shutter is opened.

By pushing down or rotating the main switch 1401, power of the digital camera is switched on or off.

The viewfinder 1402 is placed above the lens 1404 on the front side of the digital camera and is a device for recognizing an area to be photographed or the focus point from the viewfinder eyepiece 1407 illustrated in FIG. 21B.

The flash portion 1403 is positioned in an upper portion on the front side of the digital camera. When the luminance of an object to be photographed is not enough, auxiliary light is emitted from the flash portion 1403 at the same time as the release button 1400 is pressed down to open the shutter.

The lens 1404 is placed at the front of the digital camera and includes a focusing lens, a zoom lens, and the like. The lens forms a photographic optical system with a shutter and a diaphragm which are not illustrated. Further, an imaging device such as a charge coupled device (CCD) is provided behind the lens.

The lens barrel 1405 moves the position of the lens in order to adjust the focus of the focusing lens, the zoom lens, and the like. When a picture is taken, the lens barrel is slid out so that the lens 1404 moves forward. Moreover, when the digital camera is carried, the lens 1404 is moved backward to be compact. Note that in this embodiment, the digital camera can zoom in on an object to be photographed by sliding out the lens barrel; however, the structure of the digital camera is not limited to this structure. Alternatively, a digital camera can zoom in on an object to be photographed without sliding out the lens barrel with the use of the structure of the photographic optical system in the housing 1406.

The viewfinder eyepiece 1407 is positioned in the upper portion on the rear side of the digital camera and provided for looking therethrough in checking an area to be photographed and the focus point.

The operation buttons 1409 are buttons having a variety of functions, which are provided on the rear side of the digital camera, and include a setup button, a menu button, a display button, a functional button, a selection button, and the like.

When the photodetector which is one embodiment of the present invention is incorporated in the camera illustrated in FIGS. 21A and 21B, the photodetector can detect whether light exists or not and the light intensity; thus, exposure adjustment of the camera or the like can be performed.

As described above, in the photodetector which is one embodiment of the present invention, the dynamic range with respect to the illuminance of light can be increased for photoelectric conversion. Accordingly, by applying the photodetector which is one embodiment of the present invention to a photo-detection portion of the above electronic devices, luminance adjustment can be performed with high accuracy.

In addition, the photodetector which is one embodiment of the present invention can be applied to other electronic devices such as a projection TV and a navigation system. In other words, the photodetector can be applied to any electronic device that needs to detect light.

Figure 22:
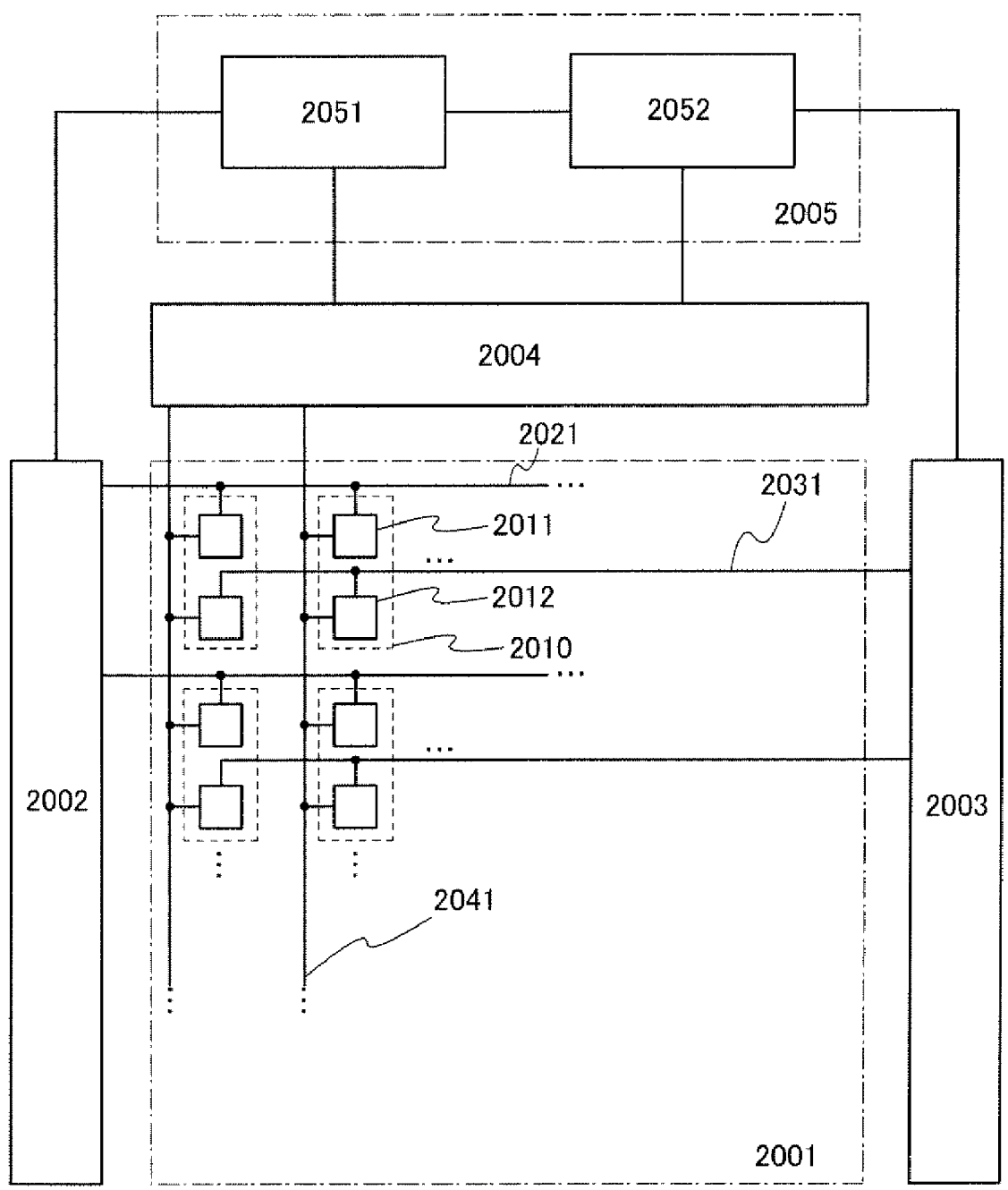
FIG. 22 is a schematic diagram illustrating a structure of an electronic device in Embodiment 3, to which a photodetector of the present invention is applied.

Further, an example where the photodetector which is one embodiment of the present invention is applied to an image input/output device with a built-in sensor will be described with reference to FIG. 22. FIG. 22 illustrates a structure of an image input/output device with a built-in sensor in this embodiment.

The image input/output device with the built-in sensor illustrated in FIG. 22 includes a pixel portion 2001, a first scan line driver circuit 2002, a plurality of first scan lines 2021, a second scan line driver circuit 2003, a plurality of second scan lines 2031, a signal line driver circuit 2004, a plurality of signal lines 2041, and a control portion 2005. Note that the image input/output device with the built-in sensor illustrated in FIG. 22 is an active matrix type.

The pixel portion 2001 includes a plurality of pixels 2010. Each pixel 2010 includes a pixel circuit 2011 and a sensor circuit 2012.

The pixel circuit 2011 can be constituted by a switching element and a display element which is connected to the signal line 2041 through the switching element. Examples of the display element are an element that changes a polarization state of light passing therethrough, such as a liquid crystal element, and a light-emitting element such as an EL (electroluminescence) element. In the case of using a liquid crystal element, alignment of liquid crystal molecules is controlled so that a polarization state of light passing through the liquid crystal element is controlled, whereby the amount of transmission light is adjusted to express desired luminance. Moreover, in the case of using a light-emitting element, by controlling a voltage applied to the light-emitting element, the light-emitting element is adjusted to express desired luminance.

The sensor circuit 2012 has a function of generating a current depending on the illuminance of incident light. The sensor circuit 2012 can be constituted by a switching element and a photodetector circuit which is connected to the signal line through the switching element, for example. The photodetector which is one embodiment of the present invention can be provided in the photodetector circuit in the sensor circuit 2012, for example. Alternatively, only a photoelectric conversion circuit may be provided in the photodetector circuit in the sensor circuit 2012, and a temperature compensation circuit and a digital signal generation circuit may be provided for each signal line 2041. By providing the temperature compensation circuit and the digital signal generation circuit for each signal line 2041, the circuit area can be reduced. Note that for the image input/output device with the built-in sensor illustrated in FIG. 22, the case where the sensor circuit 2012 is provided in each pixel 2010 is described; however, one embodiment of the present invention is not limited thereto and one sensor circuit 2012 may be provided for a plurality of pixels. Further, a photoelectric conversion circuit, a temperature compensation circuit, and a digital signal generation circuit can be applied to the sensor circuit 2012.

The first scan line driver circuit 2002 is electrically connected to the pixel circuit 2011 in the pixel 2010 through the first scan line 2021.

The second scan line driver circuit 2003 is electrically connected to the sensor circuit 2012 through the second scan line 2031.

The signal line driver circuit 2004 is electrically connected to the pixel circuit 2011 and the sensor circuit 2012 through the signal line 2041. Note that for the image input/output device with the built-in sensor illustrated in FIG. 22, the example where the pixel circuit and the sensor circuit are electrically connected to the same signal line driver circuit is described; however, one embodiment of the present invention is not limited thereto and the pixel circuit and the sensor circuit may be electrically connected to different signal line driver circuits.

The control portion 2005 includes a first control circuit 2051 for controlling the pixel circuit 2011 and a second control circuit 2052 for controlling the sensor circuit 2012.

Next, the operation of the image input/output device with the built-in sensor illustrated in FIG. 22 will be described.

The operation of the image input/output device with the built-in sensor illustrated in FIG. 22 is classified into two periods: a display period and a reading period. The operation in each period is described below.

First, in the display period, a signal is input from the first scan line driver circuit 2002 to the pixel circuit 2011 through the first scan line 2021 in accordance with a signal input from the first control circuit 2051, so that the pixels 2010 are sequentially selected. To the selected pixel 2010, a signal for display is input from the signal line driver circuit 2004 through the signal line 2041, and display is performed in each pixel 2010.

Next, in the reading period, a signal is input from the second scan line driver circuit 2003 to the sensor circuit 2012 through the second scan line 2031 in accordance with a signal input from the second control circuit 2052, so that the pixels 2010 are sequentially selected. From the selected pixel 2010, a signal generated in accordance with the illuminance of light entering the sensor circuit 2012 is output to the signal line driver circuit 2004 through the signal line 2041, and reading is performed in each pixel 2010.

By this reading operation, when an input means such as a pen or a finger is placed over any of the pixels 2010, for example, the illuminance of light entering the sensor circuit 2012 is changed. The position of the pixel can be specified using a signal generated in accordance with the changed illuminance as data, whereby text input and position detection can be performed as in a touch panel.

Moreover, in the image input/output device with the built-in sensor illustrated in FIG. 22, when an object to be read such as a document is placed over the pixel portion and a signal depending on the illuminance of incident light is generated in each pixel, the object is read and a read image can be displayed on the display portion 2001 as data in the next display period.

In addition, without limitation to the above operation, the image input/output device with the built-in sensor in this embodiment can be provided with a variety of functions in combination with another circuit. For example, a fingerprint is read by the above reading operation and the read fingerprint is checked against data on a plurality of fingerprints that are separately held in a memory or the like.

As described above, by the provision of the photodetector which is one embodiment of the present invention, the image input/output device with the built-in sensor can have a text input function and a position detection function like a touch panel, and further can read an object to be read like a scanner and display a read image on the display portion.

Note that this embodiment can be combined with any of other embodiments as appropriate.

This application is based on Japanese Patent Application serial no. 2008-226774 filed with Japan Patent Office on Sep. 4, 2008, the entire contents of which are hereby incorporated by reference.

What is claimed is:

1. A photodetector comprising:
   a photoelectric conversion circuit configured to generate a first current depending on an illuminance of light entering the photoelectric conversion circuit and generate a first voltage by converting the first current into a log-compressed voltage;

a temperature compensation circuit configured to generate a second voltage by performing temperature compensation for the first voltage and generate a second current by converting the second voltage into a current; and a digital signal generation circuit configured to generate a clock signal oscillating at a frequency depending on the second current, count the number of pulses of the clock signal for a certain period, and generate a digital signal using a count value tar the certain period as data.

2. The photodetector according to claim 1, wherein the photoelectric conversion circuit includes a photoelectric conversion element and a diode.

3. The photodetector according to claim 1, wherein the temperature compensation circuit includes a resistor and a diode.

4. The photodetector according to claim 1, wherein the temperature compensation circuit includes an amplifier circuit.

5. A photodetector comprising:
   a photoelectric conversion circuit including a photoelectric conversion element and a first diode, the photoelectric conversion circuit being configured to generate a first current depending on an illuminance of light entering the photoelectric conversion element and generate a first voltage by converting the first current into a log-compressed voltage by the first diode;

a temperature compensation circuit configured to perform temperature compensation for the first voltage; and a digital signal generation circuit configured to generate a clock signal oscillating at a frequency depending on the second current, count the number of pulses of the clock signal for a certain period, and generate a digital signal using a count value for the certain period as data, wherein the temperature compensation circuit includes:

a reference voltage generation circuit including a resistor and a second diode, the reference voltage generation circuit being configured to generate a reference voltage by converting a current flowing through the resistor into a log-compressed voltage by the second diode;

an arithmetic circuit configured to generate a second voltage depending on a difference between the first voltage and the reference voltage; and an output circuit configured to generate a second current by converting the second voltage into a current.

6. The photodetector according to claim 5, wherein the temperature compensation circuit includes an amplifier circuit.

7. A photodetector comprising:
   a photoelectric conversion circuit including a photoelectric conversion element and a first diode, the photoelectric conversion circuit being configured to generate a first current depending on an illuminance of light entering the photoelectric conversion element and generate a first voltage by converting the first current into a log-compressed voltage by the first diode;

a temperature compensation circuit configured to generate a second voltage by performing temperature compensation for the first voltage and generate a second current by converting the second voltage into a current; and a digital signal generation circuit, wherein the digital signal generation circuit includes:
- a first clock signal generation circuit configured to generate a first clock signal oscillating at a frequency depending on the second current;
- a second clock signal generation circuit configured to generate a second clock signal oscillating at a predetermined frequency;
- a first counter circuit configured to count the number of pulses of the first clock signal;
- a second counter circuit configured to set a period for counting the first clock signal by counting the number of pulses of the second clock signal up to a given value; and
- a latch circuit configured to hold a count value of the first clock signal as digital signal data.

8. The photodetector according to claim 7, wherein the temperature compensation circuit includes an amplifier circuit.

9. The photodetector according to claim 7, wherein the first clock signal generation circuit includes:
- a ramp wave signal generation circuit configured to generate a ramp wave signal depending on the second current;
- a waveform shaping circuit configured to generate a square wave signal by shaping the ramp wave signal; and
- a buffer circuit configured to generate the first clock signal from the square wave signal.

10. The photodetector according to claim 7, wherein the second clock signal generation circuit includes:
- a constant current circuit including a current source for generating a constant current;
- a ramp wave signal generation circuit configured to generate a ramp wave signal depending on the constant current;
- a waveform shaping circuit configured to generate a square wave signal by shaping the ramp wave signal; and
- a buffer circuit configured to generate the second clock signal from the square wave signal.

11. A photodetector comprising:
- a photoelectric conversion circuit including a photoelectric conversion element and a first diode, the photoelectric conversion circuit being configured to generate a first current depending on an illuminance of light entering the photoelectric conversion element and generate a first voltage by converting the first current into a log-compressed voltage by the first diode;
- a temperature compensation circuit configured to perform temperature compensation for the first voltage; and
- a digital signal generation circuit, wherein the temperature compensation circuit includes:
- a reference voltage generation circuit including a resistor and a second diode, the reference voltage generation circuit being configured to generate a reference voltage by converting a current flowing through the resistor into a log-compressed voltage by the second diode;
- an arithmetic circuit configured to generate a second voltage depending on a difference between the first voltage and the reference voltage; and
- an output circuit configured to generate a second current by converting the second voltage into a current, and wherein the digital signal generation circuit includes:
- a first clock signal generation circuit configured to generate a first clock signal oscillating at a frequency depending on the second current;
- a second clock signal generation circuit configured to generate a second clock signal oscillating at a predetermined frequency;
- a first counter circuit configured to count the number of pulses of the first clock signal;
- a second counter circuit configured to set a period for counting the first clock signal by counting the number of pulses of the second clock signal up to a given value; and
- a latch circuit configured to hold a count value of the first clock signal as digital signal data.

12. The photodetector according to claim 11, wherein the temperature compensation circuit includes an amplifier circuit.

13. The photodetector according to claim 11, wherein the first clock signal generation circuit includes:
- a ramp wave signal generation circuit configured to generate a ramp wave signal depending on the second current;
- a waveform shaping circuit configured to generate a square wave signal by shaping the ramp wave signal; and
- a buffer circuit configured to generate the first clock signal from the square wave signal.

14. The photodetector according to claim 11, wherein the second clock signal generation circuit includes:
- a constant current circuit including a current source for generating a constant current;
- a ramp wave signal generation circuit configured to generate a ramp wave signal depending on the constant current;
- a waveform shaping circuit configured to generate a square wave signal by shaping the ramp wave signal; and
- a buffer circuit configured to generate the second clock signal from the square wave signal.

\* \* \* \* \*